US012743252B2

(12) United States Patent
Fujiwara et al.

(10) Patent No.: US 12,743,252 B2
(45) Date of Patent: Sep. 22, 2026

(54) COMPUTE-IN-MEMORY CELL

(71) Applicant: Taiwan Semiconductor Manufacturing Company, Ltd., Hsinchu (TW)

(72) Inventors: Hidehiro Fujiwara, Hsinchu (TW); Haruki Mori, Hsinchu (TW); Wei-Chang Zhao, Hsinchu (TW); Chia-Fu Lee, Hsinchu (TW); Nail Etkin Can Akkaya, San Jose, CA (US); Mahmut Sinangil, Campbell, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1092 days.

(21) Appl. No.: 17/855,089

(22) Filed: Jun. 30, 2022

(65) Prior Publication Data

US 2023/0315389 A1 Oct. 5, 2023

Related U.S. Application Data

(60) Provisional application No. 63/327,164, filed on Apr. 4, 2022.

(51) Int. Cl.
*G06F 7/57* (2006.01)
*G11C 11/413* (2006.01)
(Continued)

(52) U.S. Cl.
CPC .............. *G06F 7/57* (2013.01); *G11C 11/413* (2013.01); *G11C 11/419* (2013.01); *G11C 11/54* (2013.01)

(58) Field of Classification Search
CPC . G06F 7/525; G06F 7/527; G06F 7/57; G11C 11/412; G11C 11/413; G11C 11/417; G11C 11/419; G11C 11/54
See application file for complete search history.

(56) References Cited

U.S. PATENT DOCUMENTS 10,839,894 B2 11/2020 Chen et al.
10,958,272 B2 3/2021 Shu et al.
(Continued)

FOREIGN PATENT DOCUMENTS

TW I706414 B 10/2020
TW I748397 B 12/2021
TW 202203007 A 1/2022

OTHER PUBLICATIONS

Maini, A. K. (2007). Digital electronics: Principles, devices and applications. Wiley-Blackwell. (Year: 2007).*
(Continued)

*Primary Examiner* — Andrew Caldwell
*Assistant Examiner* — Kenny K. Bui
(74) *Attorney, Agent, or Firm* — Merchant & Gould P.C.

(57) ABSTRACT

A device includes a first memory cell, a second memory cell, a first logic element, a second logic element, and a third logic element. The first memory cell is configured to store a first bit at a first node, and the second memory cell is configured to store a second bit at a second node. The first logic element includes a first node input terminal coupled to the first node, the second logic element includes a second node input terminal coupled to the second node, and the third logic element includes a first input terminal coupled to a first output terminal of the first logic element and a second input terminal coupled to a second output terminal of the second logic element.

20 Claims, 16 Drawing Sheets

(51) Int. Cl.
*G11C 11/419* (2006.01)
*G11C 11/54* (2006.01)

(56) References Cited

U.S. PATENT DOCUMENTS

| | | | | |
|---|---|---|---|---|
| 11,176,991 | B1 | 11/2021 | Shaik et al. | |
| 11,398,273 | B1 * | 7/2022 | Nataraj | G11C 11/419 |
| 2019/0043560 | A1 * | 2/2019 | Sumbul | G06N 3/08 |
| 2019/0102359 | A1 * | 4/2019 | Knag | G11C 11/418 |
| 2022/0028445 | A1 | 1/2022 | Park et al. | |

OTHER PUBLICATIONS

Chih et al., "16.4 An 89TOPS/W and 16.3TOPS/mm2 All-Digital SRAM-Based Full-Precision Compute-In Memory Macro in 22nm for Machine-Learning Edge Applications," 2021 IEEE (ISSCC), 2021, pp. 252-254, doi: 10.1109/ISSCC42613.2021.9365766. (Year: 2021).*

Yu et al., "A Logic-Compatible eDRAM Compute-In-Memory With Embedded ADCs for Processing Neural Networks," in IEEE Transactions on Circuits and Systems I: Regular Papers, vol. 68, No. 2, pp. 667-679, Feb. 2021, doi: 10.1109/TCSI.2020.3036209. (Year: 2021).*

Drummond et al., "What is the point of converting everything to NAND/NOR and how do you do it right?", <https://web.archive.org/web/20201030142121/https://electronics.stackexchange.com/questions/203605/what-is-the-point-of-converting-everything-to-nand-nor-and-how-do-you-do-it-righ> (Year: 2020).*

RoyC et al., "Why is there a limit on the number of inputs a logic gate can have?", <https://web.archive.org/web/20210225012452/https://electronics.stackexchange.com/questions/538996/why-is-there-a-limit-on-the-number-of-inputs-a-logic-gate-can-have/539116> (Year: 2021).*

* cited by examiner

| RSEL[1] | RSEL[0] | XIN | RWLB[1] | RWLB[0] | DB[1] | DB[0] | OUT |
|---|---|---|---|---|---|---|---|
| 1 | 0 | 1 | 0 | 1 | 0 | X | 1 |
| | | | | | 1 | X | 0 |
| 1 | 0 | 0 | 1 | 1 | X | X | 0 |
| 0 | 1 | 1 | 1 | 0 | X | 0 | 1 |
| | | | | | X | 1 | 0 |
| 0 | 1 | 0 | 1 | 1 | X | X | 0 |

| 470 | 2rows (476) | | 3rows (478) | | 4rows (480) | | 5rows (482) | |
|---|---|---|---|---|---|---|---|---|
| | Conv | New | Conv | New | Conv | New | Conv | New |
| # of RWL (472) | 5 | 2 | 7 | 3 | 9 | 4 | 11 | 5 |
| # of Tr (474) | 12 | 8 | 16 | 12 | 20 | 20 | 24 | 30 |

COMPUTE-IN-MEMORY CELL

CROSS-REFERENCE TO RELATED APPLICATIONS

This application claims the benefit of U.S. Provisional Application No. 63/327,164, filed Apr. 4, 2022, and titled "COMPUTE IN MEMORY CELL," the disclosure of which is hereby incorporated herein by reference.

BACKGROUND

This disclosure relates generally to in-memory computing systems, referred to as compute-in-memory (CIM) systems, and further to memory cells and memory arrays used in data processing, such as in multiply-accumulate (MAC) operations. CIM systems store information in the memory of a computer, such as in the random-access memory (RAM) of a computer, and perform calculations at the memory cell level, rather than moving large quantities of data between the memory of the computer and a processor for each computational step. Since the data is accessed from the memory of the computer and processed in the same memory, operations are much quicker, enabling faster reporting and decision-making in business and machine learning (ML) applications. Efforts are ongoing to improve the performance of CIM systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
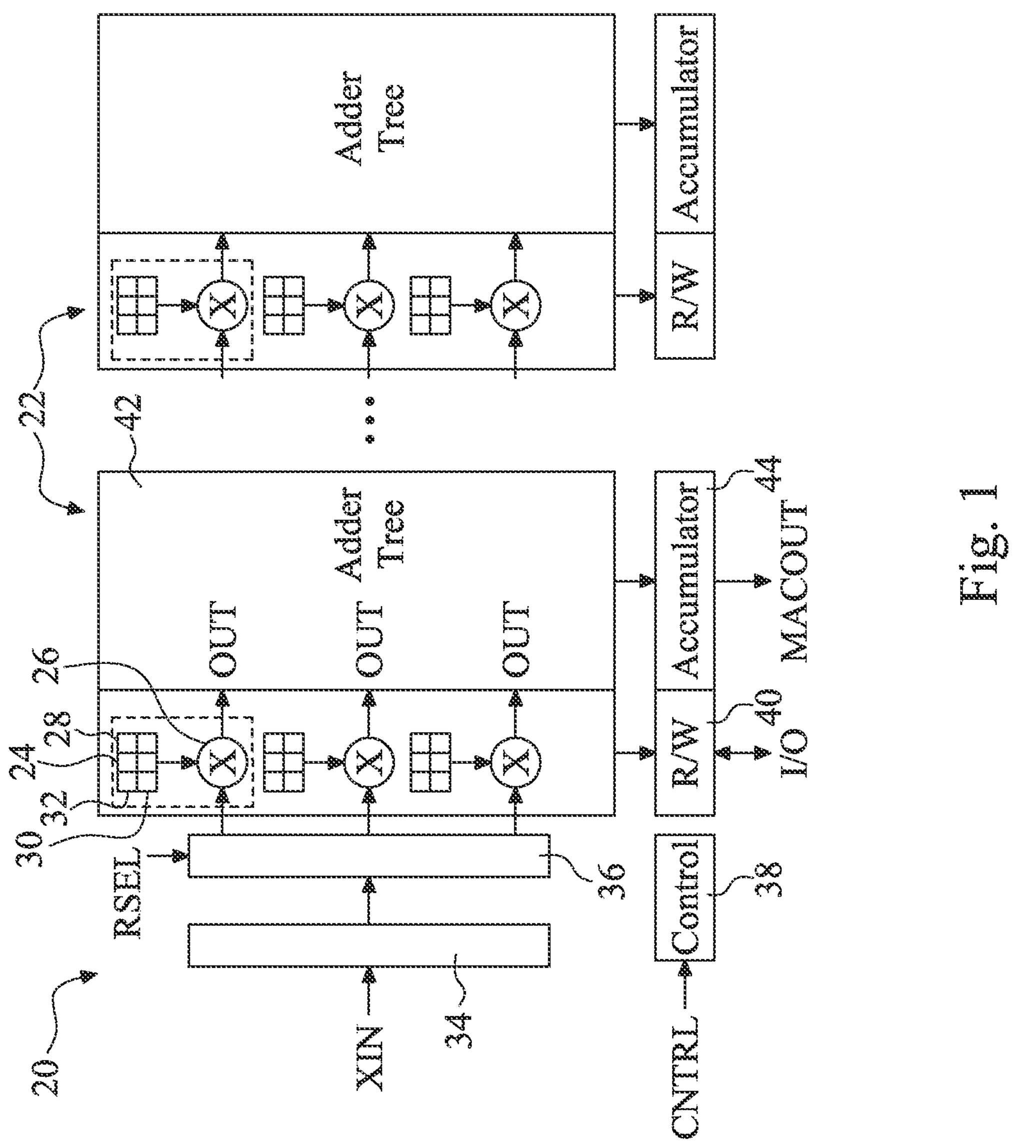
FIG. 1 is a diagram schematically illustrating a CIM device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Artificial intelligence (AI) uses deep learning techniques, where a computer system may be organized as a neural network having a plurality of interconnected processing nodes that enable the analysis of data. Neural networks include multiple layers of computational nodes, where deeper layers perform computations based on results of computations performed by higher layers. Also, in some neural networks, weights are computed and used to perform computations on input data.

AI systems include ML systems, where computer algorithms improve automatically through experience and data. The ML algorithms build models based on sample data, known as training data, to make predictions or decisions without being explicitly programmed to do so. In these systems, input data is compared to the trained data, i.e., the computational analysis of properties of known data such as the training data. Example systems can be found in the field of object recognition, where the systems analyze the properties of many known images, such as a thousand or more images, to determine patterns that can be used to perform statistical analysis to identify input images/objects. In some embodiments, the AI systems are referred to as convolutional neural networks (CNN).

ML is very computationally intensive, where ML neural networks compute weights to perform computations on input data. ML includes computing dot-products and the absolute difference of vectors, which can be computed using MAC operations performed on data such as the input data and the weights. The computations for large and deep neural networks involve many data elements, such that it is not practical to store the data in processor cache memory that is prohibitively expensive due to the memory sizes and the cost of the cache memory. Also, transferring data between other memory resources, such as RAM and a processor, is very time consuming and becomes a bottleneck for the ML system. In addition, as data sets increase in size, the time and energy/power consumed in moving the data ends up being multiples of the time and energy/power used by the processor to perform the computations.

Thus, CIM circuits have been developed for performing neural network computations. CIM circuits perform operations locally within a memory without sending the data to a host processor. This reduces the amount of data transferred between memory and the host processor, which enables higher throughput and performance. Also, the reduction in data transferred reduces energy/power consumed by the system.

In some CIM systems, a memory array includes memory cells that store weight data, and an input driver provides input data. The memory cells can be arranged in rows and columns, and the weight data can be stored in any suitable type of memory cells, such as data latches, flip-flops, and/or other memory cells, such as flash memory, magnetic random-access memory (MRAM), resistive random-access memory (RRAM), static random-access memory (SRAM), and dynamic random-access memory (DRAM) such as one transistor one capacitor (1T1C) memory cells.

In some CIM neural network applications, MAC operations compute the product of two numbers and add the products. Memory cells that store weight data are coupled to logic circuits, such as a multiply circuits, that provide output data based on the weight data and input data. The outputs of the logic circuits are accumulated, or added, using an adder circuit to obtain an output value. In these systems, if the number of rows of memory cells involved in CIM memory read operations is less than or equal to four rows, the space on the chip used for the memory cells and the conventional static read ports is larger than necessary.

Disclosed embodiments include CIM devices that include memory cells electrically connected to multiplication logic circuits that provide bitwise multiplication computations, where data from the memory cells are multiplied by input data. In some embodiments, the multiplication logic circuits provide bitwise multiplication for two rows of memory cells. In some embodiments, the multiplication logic circuits provide bitwise multiplication for three rows of memory cells. In some embodiments, the multiplication logic circuits provide bitwise multiplication for four rows of memory cells. In some embodiments, the data from the memory cells are weights used in neural networks, such as CNNs. In other embodiments, the multiplication logic circuits can be configured to provide bitwise multiplication for more than four rows of memory cells, such that bitwise multiplication for more than four rows of memory cells is within the scope of this disclosure.

Disclosed embodiments include six transistor and eight transistor SRAM cells connected to select logic and multiplication logic circuits. In some embodiments, the select logic circuits include NAND gates. In some embodiments, the select logic circuits include AND gates. In some embodiments, the multiplication logic circuits include OR gates and NAND gates. In some embodiments, the multiplication logic circuits include AND gates and NOR gates. In other embodiments, the memory includes different memory cells, such as other data latches, flip-flops, and/or memory cells including flash memory, MRAM, RRAM, SRAM, and DRAM cells. In some embodiments, the memory includes 1T1C memory cells.

In disclosed embodiments, the number of transistors and read word lines used in the multiplication logic circuits are reduced compared to previous read port configurations. In some embodiments, the transistors and read word lines used in the multiplication logic circuits are reduced to eight transistors and two read word lines compared to twelve transistors and five read word lines in the other read port configurations.

Advantages of the disclosed embodiments provide CIM memory cell and logic circuit arrangements that reduce the amount of space occupied on a chip, provide in-memory multiply operations that improve performance such as speed performance, and reduce energy/power requirements. Thus, improving power, performance, and area (PPA).

FIG. 1 is a diagram schematically illustrating a CIM device 20, in accordance with some embodiments. The CIM device 20 includes a CIM memory array 22 that includes memory cell blocks 24 and multiplication circuits 26. Each of the memory cell blocks 24 includes memory cells 28 configured to store bits of data and arranged into two memory cell rows 30 and 32. The rows 30 and 32 are electrically coupled to a corresponding one of the multiplication circuits 26 to provide the stored bits of data to the multiplication circuit 26. In some embodiments, the memory cells 28 are configured to store weight data, such as weights for CNNs. In other embodiments, the memory cells 28 are arranged into more than two rows 30 and 32, such as three rows or four rows, and the memory cells 28 from the rows are electrically coupled to the corresponding one of the multiplication circuits 26. Also, in other embodiments, the memory cells 28 can be arranged into more than four rows of memory cells and the memory cells 28 from the more than four rows electrically coupled to the corresponding one or more of the multiplication circuits 26.

In some embodiments, the memory cells 28 include SRAM cells. In an SRAM cell, data is written into and read from the SRAM cell via one or more bit-lines, such as a bit-line (BL) and a complementary bit-line, referred to as bit-line bar (BLB). The data is written into and read from the SRAM cell upon activation of one or more access transistors in the SRAM cell by a word line (WL) signal. In other embodiments, the memory cells 28 include different memory cells, such as data latches, flip-flops, and/or other memory cells including flash memory, MRAM, RRAM, SRAM, and DRAM cells. In some embodiments, the memory cells 28 include 1T1C memory cells.

The CIM device 20 further includes an input driver 34 and a WL driver 36. The input driver 34 is configured to receive and drive input signals XIN to the word line driver 36. The WL driver 36 is configured to receive the input signals XIN from the input driver 34 and read select signals RSEL and provide read word line signals to the multiplication circuits 26 to activate rows 30 and 32 of the memory array 22.

A memory controller 38 receives control signals CNTRL for controlling the operation of the CIM device 20. For example, the memory controller 38 provides control signals to a read/write circuit 40 that is electrically connected to the bit-lines of the memory array 22 to select bit-lines, i.e., columns, of the memory array 22. The read/write circuit 40 receives and provides input/output (I/O) data. In some embodiments, the stored bits of data include 4-bit weights, such that four columns of memory cells 28 and multiplication circuits 26 are used to store the 4-bit weight values. Also, in some embodiments, a weight value having w bits uses w columns of memory cells 28 and corresponding multiplication circuits 26.

The output signals OUT from the multiplication circuits 26 are provided to an adder circuit 42 that adds the output signals OUT of the various multiplication circuits 26. An accumulator circuit 44 is electrically coupled to the adder circuit 42 and configured to provide a MAC output MACOUT.

Figure 2:
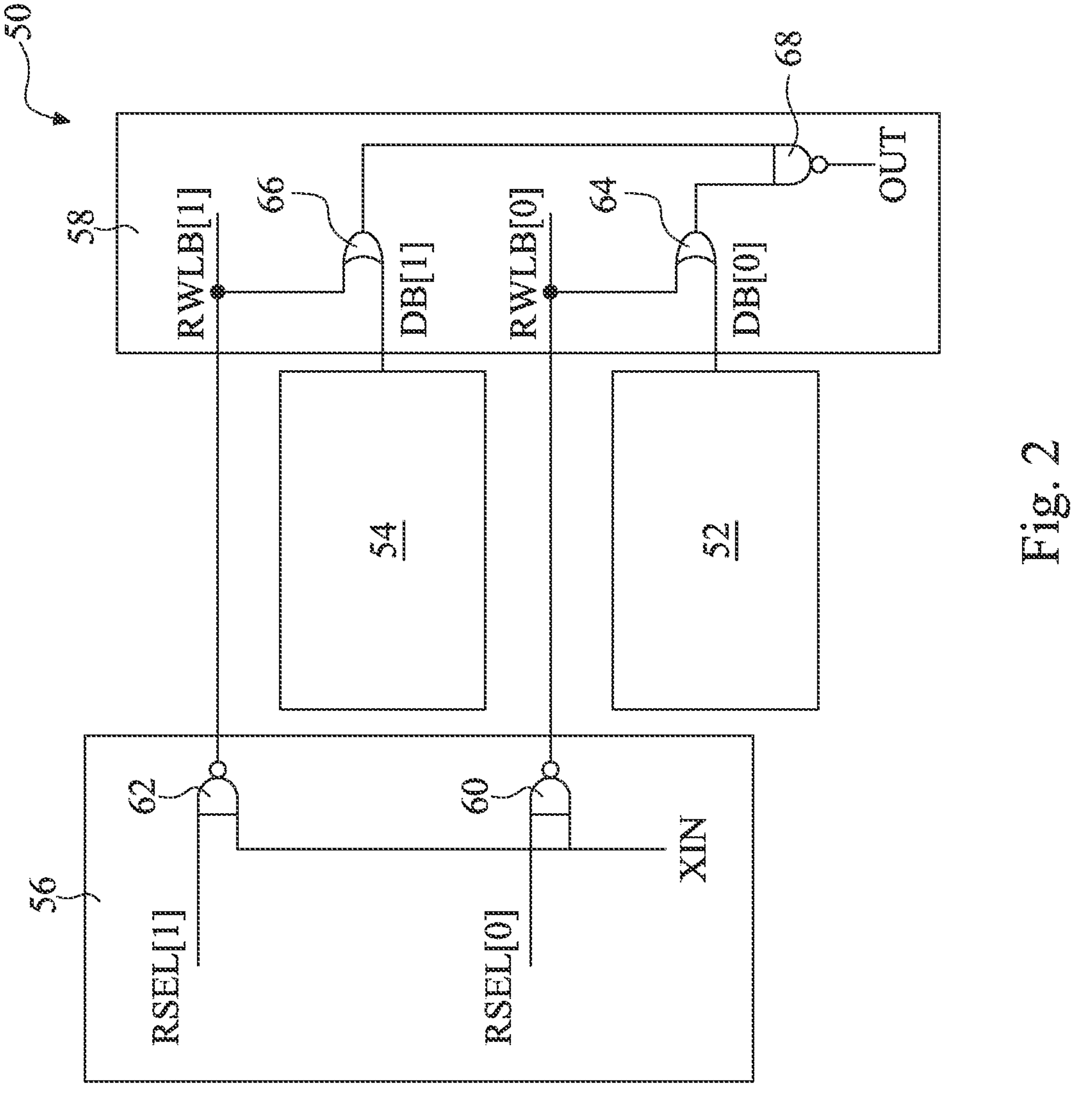
FIG. 2 is a diagram schematically illustrating a row-select and multiply circuit configured to multiply input data XIN and data from memory cells, in accordance with some embodiments.

FIG. 2 is a diagram schematically illustrating a row-select and multiply circuit 50 configured to multiply input data XIN and data from memory cells 52 and 54, in accordance with some embodiments. The row-select and multiply circuit 50 includes the memory cells 52 and 54, a word line driver 56, and a multiplication circuit 58. In some embodiments, the word line driver 56 is like the word line driver 36 (shown in FIG. 1). In some embodiments, the multiplication circuit 58 is like a multiplication circuit 26 (shown in FIG. 1). In some embodiments, the memory cells 52 and 54 are like the memory cells 28 (shown in FIG. 1) and each of the memory cells 52 and 54 is from a different one of the rows 30 and 32 of a memory cell block 24. In other embodiments, the row-select and multiply circuit 50 is configured to multiply input data XIN and data from memory cells in more than two rows, such as from three rows or four rows of memory cells.

The word line driver 56 includes NAND gates 60 and 62 that are electrically coupled to the multiplication circuit 58. Each of the NAND gates 60 and 62 is configured to receive the input signal XIN and one of the read select signals RSEL[0] and RSEL[1]. Also, each of the NAND gates 60 and 62 is configured to provide one of the read word line signals RWLB[0] and RWLB[1] to the multiplication circuit 58 to activate a selected row of the memory cells 52 and 54. NAND gate 60 receives the input signal XIN and the read select signal RSEL[0] and provides read word line signal RWLB[0] to the multiplication circuit 58. NAND gate 62 receives the input signal XIN and the read select signal RSEL[1] and provides read word line signal RWLB[1] to the multiplication circuit 58.

The memory cells 52 and 54 are electrically coupled to the multiplication circuit 58 to provide stored bits of data to the multiplication circuit 58 in the data signals DB[0] and DB[1]. In some embodiments, the memory cells 52 and 54 are SRAM cells. In other embodiments, the memory cells 52 and 54 are data latches, flip-flops, and/or other memory cells such as flash memory, MRAM, RRAM, SRAM, and DRAM cells. In some embodiments, the memory cells 52 and 54 are 1T1C memory cells. In some embodiments, the memory cells 52 and 54 are configured to store weight data, such as weights for CNNs.

The multiplication circuit 58 includes logic gates for multiplying the input data signal XIN that is received from the word line driver 56 and bits of data from the memory cells 52 and 54. In this example, the multiplication circuit 58 includes a first OR gate 64, a second OR gate 66, and a NAND gate 68. In other embodiments the multiplication circuit 58 includes different logic gates.

The first OR gate 64 is configured to receive the read word line signal RWLB[0] from the word line driver 56 and the data signal DB[0] from the memory cell 52. The second OR gate 66 is configured to receive the read word line signal RWLB[1] from the word line driver 56 and the data signal DB[1] from the memory cell 54. The NAND gate 68 receives an output from each of the first and second OR gates 64 and 66 and provides the result of the multiplication at output OUT.

In operation, to select one of the memory cells 52 and 54, one of the NAND gates 60 and 62 in the word line driver 56 receives a logic high (1) read select signal RSEL[0] or RSEL[1] and the other one of the NAND gates 60 and 62 receives a logic low (0) read select signal RSEL[0] or RSEL[1]. The NAND gate 60 or 62 that receives the logic low (0) read select signal RSEL[0] or RSEL[1] is not selected and provides a logic high (1) to one of the OR gates 64 or 66, which passes the logic high (1) to one input of the output NAND gate 68. The NAND gate 60 or 62 that receives the logic high (1) read select signal RSEL[0] or RSEL[1] is selected to invert the input signal XIN and pass the inverted input signal XINB to the other one of the OR gates 64 or 66.

The OR gate 64 or 66 that receives the inverted input signal XINB also receives one of the data signals DB[0] or DB[1] from the connected memory cell 52 or 54 and provides an output signal to the other input of the output NAND gate 68. This multiplies the inverted input signal XINB and the data received from the connected memory cell 52 or 54. The NAND gate 68 provides the multiplication result at the output OUT.

Advantages of having the word line driver 56 and the in-memory multiplication circuit 58 include a reduction in space occupied on the chip, improved speed performance, and a reduction in energy/power requirements.

Figure 3:
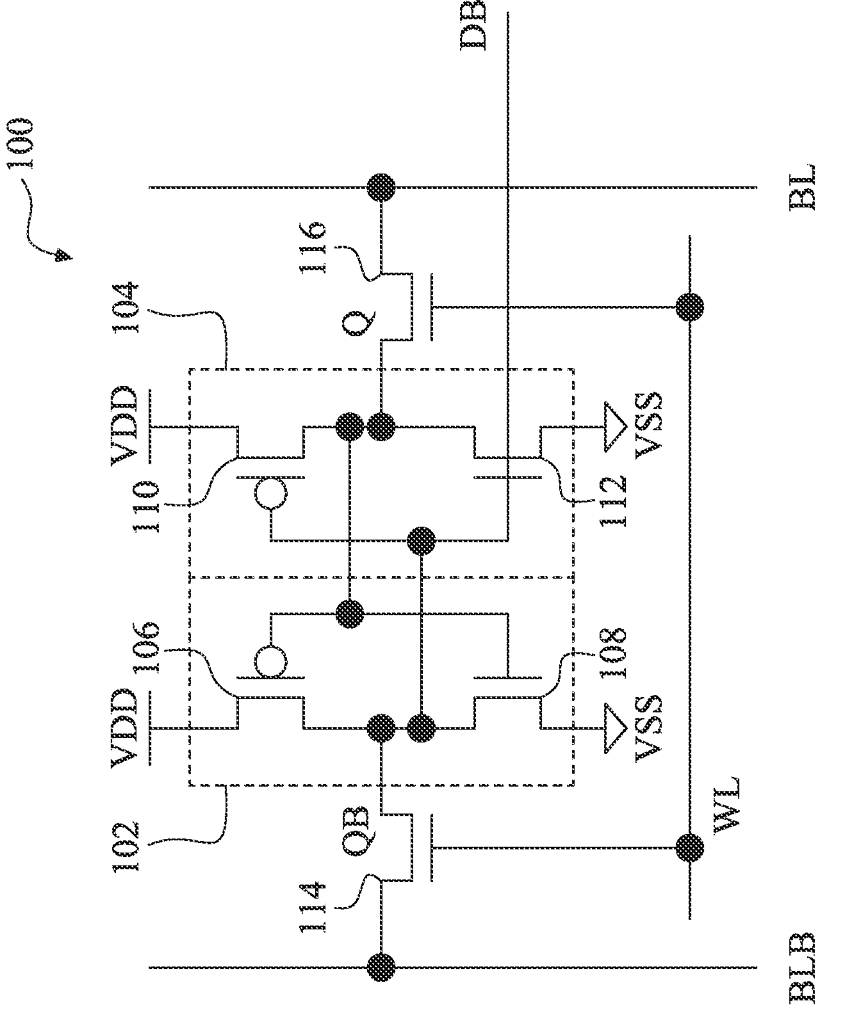
FIG. 3 is a diagram schematically illustrating an SRAM cell, in accordance with some embodiments.

FIG. 3 is a diagram schematically illustrating an SRAM cell 100, in accordance with some embodiments. The SRAM cell 100 is a six-transistor (6T) SRAM cell. In some embodiments, the SRAM cell 100 is like one or more of the memory cells 28 (shown in FIG. 1). In some embodiments, the SRAM cell 100 is like one or more of the memory cells 52 and 54 (shown in FIG. 2). In some embodiments, the SRAM cell 100 is used in the CIM device 20 of FIG. 1. In some embodiments, the SRAM cell 100 is used in the row-select and multiply circuit 50 of FIG. 2. In other embodiments, the SRAM cell 100 can include more or fewer than six transistors, such as four, eight, or ten transistors.

The SRAM cell 100 includes two cross-coupled inverters 102 and 104. The first inverter 102 includes a first PMOS/NMOS transistor pair 106 and 108, and the second inverter 104 includes a second PMOS/NMOS transistor pair 110 and 112. The SRAM cell 100 further includes a left pass gate (PGL) transistor 114 and a right pass gate (PGR) transistor 116.

Power is supplied to each of the inverters 102 and 104, where a first terminal of each of a left pull-up (PUL) transistor 106 and a right pull-up (PUR) transistor 110 is electrically coupled to a power supply VDD, and a first terminal of each of a left pull-down (PDL) transistor 108 and a right pull-down (PDR) transistor 112 is electrically coupled to a reference voltage VSS, such as ground. A bit of data is stored in the SRAM cell 100 as a voltage at node Q and can be read through the right pass gate transistor 116 via the bit line BL, where access to the node Q is controlled by the right pass gate transistor 116. The node Q bar (QB) stores the complement of the value at node Q, such that if Q is high then QB is low and vice-versa. The node QB can be read through the left pass gate transistor 114 via the bit line bar BLB, where access to the node QB is controlled by the left pass gate transistor 114.

A gate of the left pass gate transistor 114 is coupled to a word line WL. A first source/drain (S/D) terminal of the left pass gate transistor 114 is coupled to the bit line bar BLB, and a second S/D terminal of the left pass gate transistor 114 is coupled to the second terminals of left pull-up transistor 106 and left pull-down transistor 108 at the node QB and to the gates of the right pull-up transistor 110 and the right pull-down transistor 112 to provide the data bar output signal DB.

Also, a gate of the right pass gate transistor 116 is coupled to the word line WL. A first S/D terminal of the right pass gate transistor 116 is coupled to the bit line BL, and a second S/D terminal of the right pass gate transistor 116 is coupled to second terminals of right pull-up transistor 110 and right pull-down transistor 112 at the node Q and to the gates of the left pull-up transistor 106 and the left pull-down transistor 108.

Figure 4:
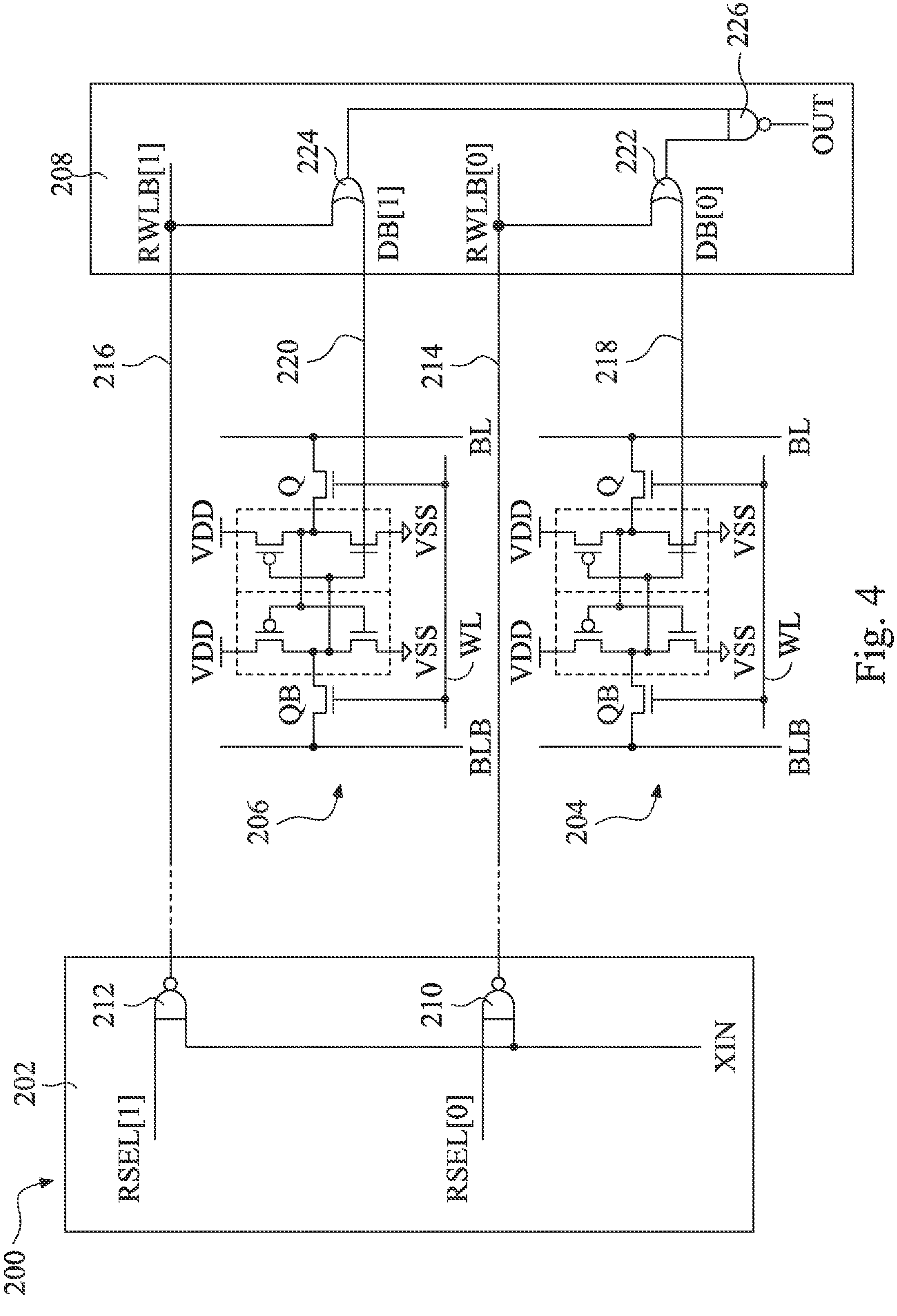
FIG. 4 is a diagram schematically illustrating a row-select and multiply circuit that includes a word line driver, two 6T SRAM memory cells, and a multiplication circuit, in accordance with some embodiments.

FIG. 4 is a diagram schematically illustrating a row-select and multiply circuit 200 that includes a word line driver 202, two 6T SRAM memory cells 204 and 206, and a multiplication circuit 208, in accordance with some embodiments. The row-select and multiply circuit 200 is configured to multiply input data bar XINB and data bar DB from memory cells 204 and 206. In other embodiments, the row-select and multiply circuit 200 is configured to multiply input data and data from memory cells in more than two rows, such as from three rows or four rows of memory cells.

The word line driver 202 includes NAND gates 210 and 212 that are electrically coupled to the multiplication circuit 208. NAND gate 210 receives the input signal XIN and the read select signal RSEL[0] and provides read word line signal RWLB[0] to the multiplication circuit 208 via first read word line 214, and NAND gate 212 receives the input signal XIN and the read select signal RSEL[1] and provides read word line signal RWLB[1] to the multiplication circuit 208 via second read word line 216. In some embodiments, the word line driver 202 is like the word line driver 36 (shown in FIG. 1). In some embodiments, the word line driver 202 is like the word line driver 56 (shown in FIG. 2).

The memory cells 204 and 206 are electrically coupled to the multiplication circuit 208 to provide stored bits of data to the multiplication circuit 208 in the data signals DB[0] and DB[1]. The memory cell 204 is configured to provide the data signal DB[0] to the multiplication circuit 208 via data line 218, and the memory cell 206 provides the data signal DB[1] to the multiplication circuit 208 via data line 220. The memory cells 204 and 206 are 6T SRAM cells like the 6T SRAM cell 100 of FIG. 3 and the description of the 6T SRAM cell will not be repeated here. Also, in some embodiments, each of the memory cells 204 and 206 is like one of the memory cells 28 (shown in FIG. 1), where each of the memory cells 204 and 206 is from a different one of the rows 30 and 32 of a memory cell block 24. In some embodiments, the memory cells 204 and 206 are configured to store weight data, such as weights for CNNs.

The multiplication circuit 208 includes a first OR gate 222, a second OR gate 224, and a NAND gate 226. The first OR gate 222 is configured to receive the read word line signal RWLB[0] from the word line driver 202 and the data signal DB[0] from the memory cell 204. The second OR gate 224 is configured to receive the read word line signal RWLB[1] from the word line driver 202 and the data signal DB[1] from the memory cell 206. The NAND gate 226 receives an output from each of the first and second OR gates 222 and 224 and provides the multiplication result at output OUT. In some embodiments, the multiplication circuit 208 is like a multiplication circuit 26 (shown in FIG. 1). In some embodiments, the multiplication circuit 208 is like the multiplication circuit 58 (shown in FIG. 2).

In operation, to select one of the memory cells 204 and 206, one of the NAND gates 210 and 212 in the word line driver 202 receives a logic high (1) read select signal RSEL[0] or RSEL[1] and the other one of the NAND gates 210 and 212 receives a logic low (0) read select signal RSEL[0] or RSEL[1]. The NAND gate 210 or 212 that receives the logic low (0) read select signal RSEL[0] or RSEL[1] is not selected and provides a logic high (1) to one of the OR gates 222 or 224, which passes the logic high (1) to one input of the output NAND gate 226. The NAND gate 210 or 212 that receives the logic high (1) read select signal RSEL[0] or RSEL[1] is selected to invert the input signal XIN and pass the inverted input signal XINB to the other one of the OR gates 222 or 224. This OR gate 222 or 224 receives the inverted input signal XINB and one of the data signals DB[0] or DB[1] and provides an output signal to the other input of the NAND gate 226. This multiplies the inverted input signal XINB and the data received from one of the data signals DB[0] or DB[1]. The NAND gate 226 provides the multiplication result at the output OUT.

Figures 5, 6:
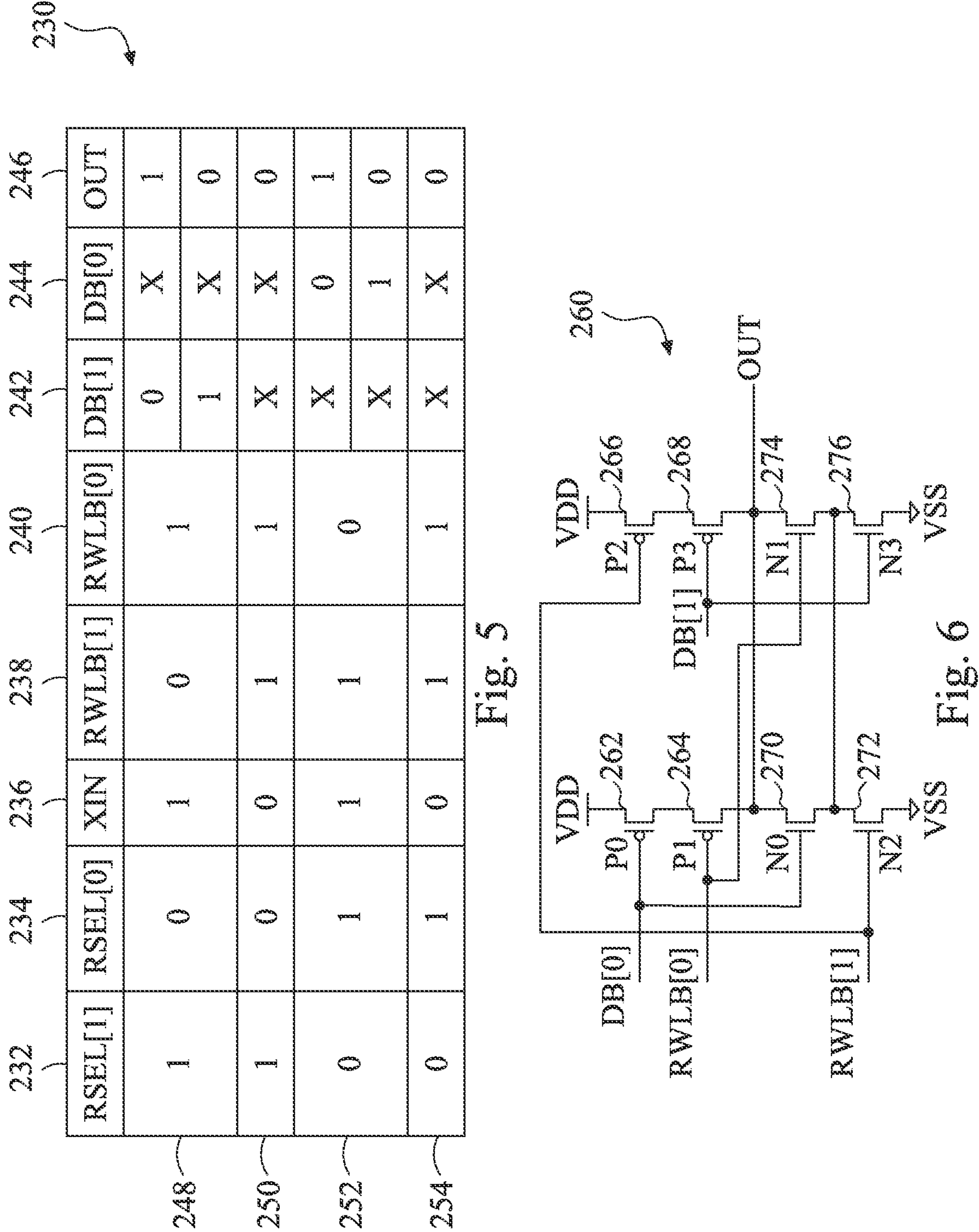
FIG. 5 is a diagram schematically illustrating a truth table for the row-select and multiply circuit of FIG. 4, in accordance with some embodiments.
FIG. 6 is a diagram schematically illustrating a MOSFET multiplication circuit that provides the functions of the multiplication circuit shown in FIG. 4, in accordance with some embodiments.

FIG. 5 is a diagram schematically illustrating a truth table 230 for the row-select and multiply circuit 200 of FIG. 4, in accordance with some embodiments. The truth table 230 includes the signals RSEL[1] at column 232, RSEL[0] at column 234, XIN at column 236, RWLB[1] at column 238, RWLB[0] at column 240, DB[1] at column 242, DB[0] at column 244, and OUT at column 246.

In row 248, the signal RSEL[1] is at a logic high (1) and RSEL[0] is at a logic low (0), which selects the NAND gate 212. XIN is at a logic high (1), such that RWLB[1] is at a logic low (0). Also, RWLB[0] is at a logic high (1) and the output of OR gate 222 is at a logic high (1) due to RSEL[0] being at a logic low (0). If DB[1] is at a logic low (0), the output of OR gate 224 is a logic low (0) and the NAND gate 226 provides a logic high (1) at the output OUT. If DB[1] is at a logic high (1), the output of OR gate 224 is a logic high (1) and the NAND gate 226 provides a logic low (0) at the output OUT.

In row 250, the signal RSEL[1] is at a logic high (1) and RSEL[0] is at a logic low (0), which selects the NAND gate 212. XIN is at a logic low (0), such that RWLB[1] is at a logic high (1) and the output of OR gate 224 is at a logic high (1). Also, RWLB[0] is at a logic high (1) and the output of OR gate 222 is at a logic high (1) due to RSEL[0] being at a logic low (0). Thus, the NAND gate 226 provides a logic low (0) at the output OUT.

In row 252, the signal RSEL[0] is at a logic high (1) and RSEL[1] is at a logic low (0), which selects the NAND gate 210. XIN is at a logic high (1), such that RWLB[0] is at a logic low (0). Also, RWLB[1] is at a logic high (1) and the output of OR gate 224 is at a logic high (1) due to RSEL[1] being at a logic low (0). If DB[0] is at a logic low (0), the output of OR gate 222 is a logic low (0) and the NAND gate 226 provides a logic high (1) at the output OUT. If DB[0] is at a logic high (1), the output of OR gate 222 is a logic high (1) and the NAND gate 226 provides a logic low (0) at the output OUT.

In row 254, the signal RSEL[0] is at a logic high (1) and RSEL[1] is at a logic low (0), which selects the NAND gate 210. XIN is at a logic low (0), such that RWLB[0] is at a logic high (1) and the output of OR gate 222 is at a logic high (1). Also, RWLB[1] is at a logic high (1) and the output of OR gate 224 is at a logic high (1) due to RSEL[1] being at a logic low (0). Thus, the NAND gate 226 provides a logic low (0) at the output OUT.

FIG. 6 is a diagram schematically illustrating a MOSFET multiplication circuit 260 that provides the functions of the multiplication circuit 208 (shown in FIG. 4), in accordance with some embodiments. The multiplication circuit 260 includes eight transistors, four PMOS transistors 262, 264, 266, and 268 and four NMOS transistors 270, 272, 274, and 276.

A first S/D of PMOS transistor 262 is electrically coupled to power VDD and a second S/D of PMOS transistor 262 is electrically coupled to a first S/D of PMOS transistor 264. Also, a first S/D of PMOS transistor 266 is electrically coupled to power VDD and a second S/D of PMOS transistor 266 is electrically coupled to a first S/D of PMOS transistor 268. The second S/D of PMOS transistor 264 is electrically coupled to the second S/D of PMOS transistor 268 and to a first S/D of each of the NMOS transistors 270 and 274. The second S/D of NMOS transistor 270 is electrically coupled to the second S/D of NMOS transistor 274 and to a first S/D of each of the NMOS transistors 272 and 276. The second S/D of each of the NMOS transistors 272 and 276 is electrically coupled to a reference VSS, such as ground.

The gates of PMOS transistor 262 and NMOS transistor 270 are electrically coupled together to receive the data signal DB[0], and the gates of PMOS transistor 268 and NMOS transistor 276 are electrically coupled together to receive the data signal DB[1]. Also, the gates of PMOS transistor 264 and NMOS transistor 274 are electrically coupled together to receive the read word line signal RWLB[0] and the gates of PMOS transistor 266 and NMOS transistor 272 are electrically coupled together to receive the read word line signal RWLB[1].

In operation, if the read word line signal RWLB[1] is at a logic low (0), the PMOS transistor 266 is biased on and the NMOS transistor 272 is biased off. Also, if the read word line signal RWLB[0] is at a logic high (1), the PMOS transistor 264 is biased off and the NMOS transistor 274 is biased on. Thus, if data signal DB[1] is at a logic low (0), the PMOS transistor 268 is biased on and the NMOS transistor 276 is biased off, such that the output OUT is at a logic high (1), and if data signal DB[1] is at a logic high (1), the PMOS transistor 268 is biased off and the NMOS transistor 276 is biased on, such that the output OUT is at a logic low (0).

Also, if the read word line signal RWLB[0] is at a logic low (0), the PMOS transistor 264 is biased on and the NMOS transistor 274 is biased off, and if the read word line signal RWLB[1] is at a logic high (1), the PMOS transistor 266 is biased off and the NMOS transistor 272 is biased on. Thus, if data signal DB[0] is at a logic low (0), the PMOS transistor 262 is biased on and the NMOS transistor 270 is biased off, such that the output OUT is at a logic high (1), and if data signal DB[0] is at a logic high (1), the PMOS transistor 262 is biased off and the NMOS transistor 270 is biased on, such that the output OUT is at a logic low (0).

If each of the read word line signal RWLB[0] and the read word line signal RWLB[1] is at a logic high (1), the PMOS transistors 264 and 266 are biased off and the NMOS transistors 272 and 274 are biased on, such that the output OUT is at a logic low (0).

Figure 7:
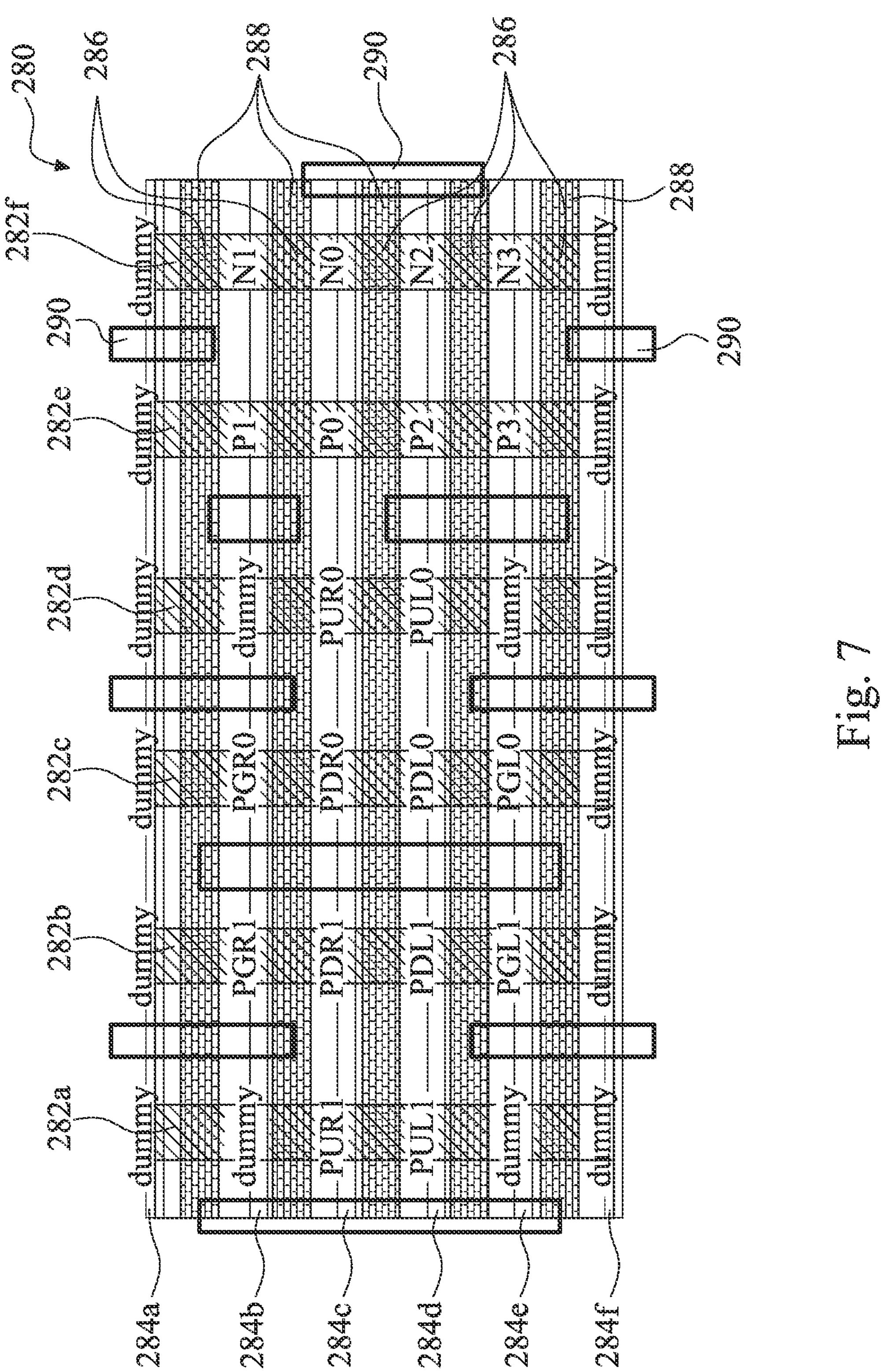
FIG. 7 is a diagram schematically illustrating a transistor layout of the memory cells shown in FIG. 4 and the multiplication circuit of FIG. 6, in accordance with some embodiments.

FIG. 7 is a diagram schematically illustrating a transistor layout 280 of the memory cells 204 and 206 (shown in FIG. 4) and the multiplication circuit 260 of FIG. 6, in accordance with some embodiments. The layout 280 includes twenty transistors, where each of the memory cells 204 and 206 is a 6T SRAM cell, such that the two memory cells 204 and 206 include twelve transistors, and the multiplication circuit 260 includes eight transistors P0-P3 and N0-N3. The layout includes six active areas 282*a*-282*f* and six gate structures 284*a*-284*f* The gate structures 284*a* and 284*f*, at the top and the bottom of the layout 280, are all dummy gate structures.

The memory cell 206 that provides data signal DB[1] is laid out with the right and left pull-up transistors PUR1 and PUL1 in the first active area 282*a* and at the gate structures 284*c* and 284*d*, respectively. The right and left pass gate transistors PGR1 and PGL1 are in the second active area 282*b* and at the gate structures 284*b* and 284*e*, respectively, and the right and left pull-down transistors PDR1 and PDL1 are in the second active area 282*b* and at the gate structures 284*c* and 284*d*, respectively.

The memory cell 204 that provides data signal DB[0] is laid out with the right and left pass gate transistors PGR0 and PGL0 in the third active area 282*c* and at the gate structures 284*b* and 284*e*, respectively, and the right and left pull-down transistors PDR0 and PDL0 in the third active area 282*c* and at the gate structures 284*c* and 284*d*, respectively. The right and left pull-up transistors PUR0 and PUL0 are in the fourth active area 282*d* and at the gate structures 284*c* and 284*d*, respectively.

The multiplication circuit is laid out with the four PMOS transistors P0-P3 in the fifth active area 282*e* and with the four NMOS transistors N0-N3 in the sixth active area 282*f*. The transistors P1 and N1 are at the gate structure 284*b*, the transistors P0 and N0 are at the gate structure 284*c*, the transistors P2 and N2 are at the gate structure 284*d*, and the transistors P3 and N3 are at the gate structure 284*e*.

As noted above, the layout 280 includes six active areas 282*a*-282*f* and six gate structures 284*a*-284*f*. The layout 280 also includes metal over diffusion (MD) layers, such as MD layers 286, that are configured to be electrically connected to the active areas 282*a*-282*f*. The layout 280 further includes cut MD (CMD) layers, such as CMD layers 288, that are configured to separate or cut the MD layers 286. In some embodiments, the layout 280 further includes metal layers, such as metal layers 290, that are backside metal layers or frontside metal layers. In some embodiments, the metal layers 290 are part of a power distribution network (PDN) in the layout 280.

Figure 8:
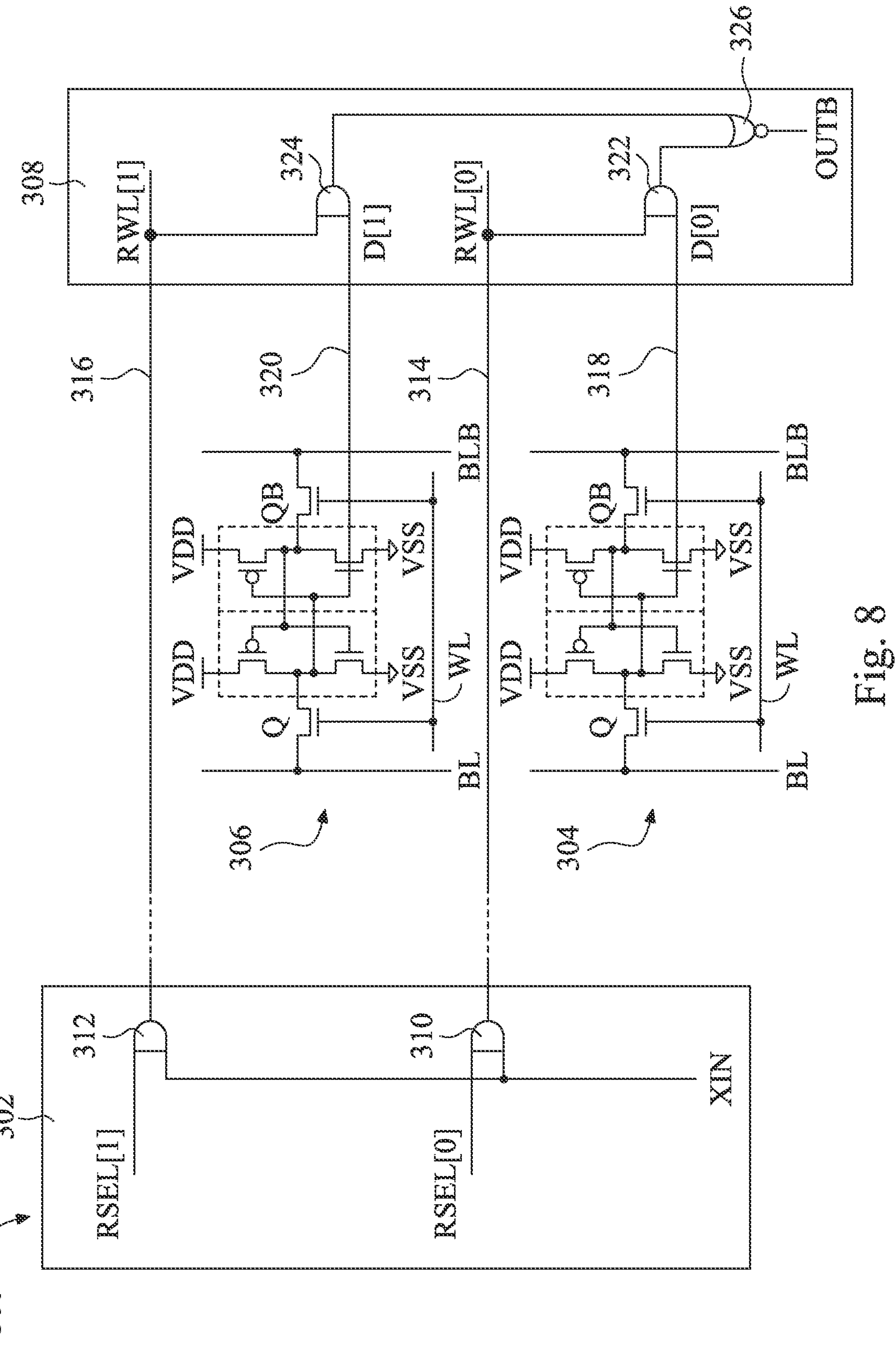
FIG. 8 is a diagram schematically illustrating a row-select and multiply circuit that changes the polarity of the signals by multiplying the input signal XIN and data signals D to provide an inverted output signal OUTB, in accordance with some embodiments.

FIG. 8 is a diagram schematically illustrating a row-select and multiply circuit 300 that changes the polarity of the signals by multiplying the input signal XIN and data signals D to provide an inverted output signal OUTB, in accordance with some embodiments. The row-select and multiply circuit 300 includes a word line driver 302, two 6T SRAM memory cells 304 and 306, and a multiplication circuit 308. The row-select and multiply circuit 300 is configured to multiply input data XIN and data D from memory cells 304 and 306. In other embodiments, the row-select and multiply circuit 300 is configured to multiply input data and data from memory cells in more than two rows, such as from three rows or four rows of memory cells.

The word line driver 302 includes AND gates 310 and 312 that are electrically coupled to the multiplication circuit 308. AND gate 310 receives the input signal XIN and the read select signal RSEL[0] and provides read word line signal RWL[0] to the multiplication circuit 308 via first read word line 314, and AND gate 312 receives the input signal XIN and the read select signal RSEL[1] and provides read word line signal RWL[1] to the multiplication circuit 308 via second read word line 316. In some embodiments, the word line driver 302 is like the word line driver 36 (shown in FIG. 1). In some embodiments, the word line driver 302 is like the word line driver 56 (shown in FIG. 2).

The memory cells 304 and 306 are electrically coupled to the multiplication circuit 308 to provide stored bits of data to the multiplication circuit 308 in the data signals D[0] and D[1]. The memory cell 304 is configured to provide the data signal D[0] to the multiplication circuit 308 via data line 318, and the memory cell 306 provides the data signal D[1] to the multiplication circuit 308 via data line 320. The memory cells 304 and 306 are 6T SRAM cells like the 6T SRAM cell 100 of FIG. 3, except the outputs Q and QB have been switched with one another and the bit-lines BL and BLB have been switched with one another. Also, the memory cells 304 and 306 are 6T SRAM cells like the 6T SRAM cell 100 of FIG. 3 such that the description of the 6T SRAM cell will not be repeated here. In some embodiments, each of the memory cells 304 and 306 is like one of the memory cells 28 (shown in FIG. 1), where each of the memory cells 304 and 306 is from a different one of the rows 30 and 32 of a memory cell block 24. In some embodiments, the memory cells 304 and 306 are configured to store weight data, such as weights for CNNs.

The multiplication circuit 308 includes a first AND gate 322, a second AND gate 324, and a NOR gate 326. The first AND gate 322 is configured to receive the read word line signal RWL[0] from the word line driver 302 and the data signal D[0] from the memory cell 304. The second AND gate 324 is configured to receive the read word line signal RWL[1] from the word line driver 302 and the data signal D[1] from the memory cell 306. The NOR gate 326 receives an output from each of the first and second AND gates 322 and 324 and provides the multiplication result at output OUTB. In some embodiments, the multiplication circuit 308 is like a multiplication circuit 26 (shown in FIG. 1). In some embodiments, the multiplication circuit 308 is like the multiplication circuit 58 (shown in FIG. 2).

In operation, to select one of the memory cells 304 and 306, one of the AND gates 310 and 312 in the word line driver 302 receives a logic high (1) read select signal RSEL[0] or RSEL[1] and the other one of the AND gates 310 and 312 receives a logic low (0) read select signal RSEL[0] or RSEL[1]. The AND gate 310 or 312 that receives the logic low (0) read select signal RSEL[0] or RSEL[1] is not selected and provides a logic low (0) to one of the AND gates 322 or 324, which passes the logic low (0) to one input of the output NOR gate 326.

The AND gate 310 or 312 that receives the logic high (1) read select signal RSEL[0] or RSEL[1] is selected to pass the input signal XIN to the other one of the AND gates 322 or 324. This AND gate 322 or 324 receives the input signal XIN and one of the data signals D[0] or D[1] and provides an output signal to the other input of the NOR gate 326. This multiplies the input signal XIN and the data received from one of the data signals D[0] or D[1]. The NOR gate 326 provides the multiplication result at the inverted output OUTB.

Figure 9:
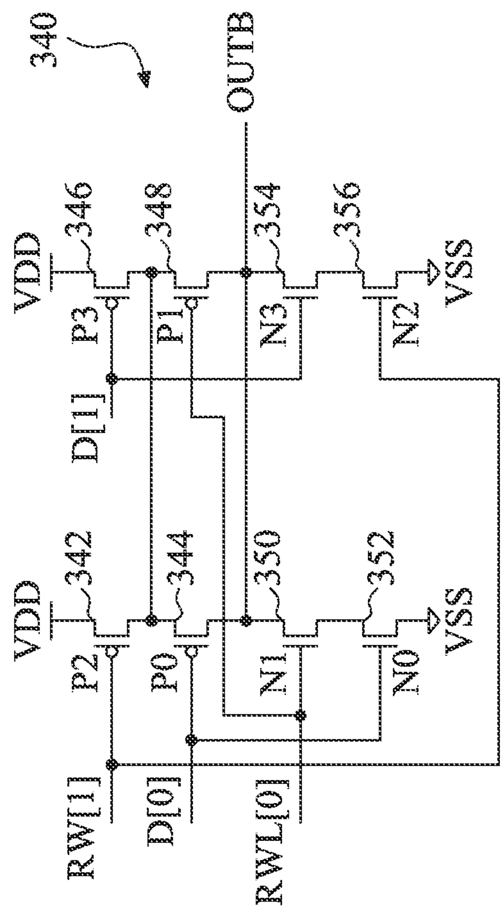
FIG. 9 is a diagram schematically illustrating a MOSFET multiplication circuit that provides the functions of the multiplication circuit shown in FIG. 8, in accordance with some embodiments.

FIG. 9 is a diagram schematically illustrating a MOSFET multiplication circuit 340 that provides the functions of the multiplication circuit 308 (shown in FIG. 8), in accordance with some embodiments. The multiplication circuit 340 includes eight transistors, four PMOS transistors 342, 344, 346, and 348 and four NMOS transistors 350, 352, 354, and 356.

A first S/D of PMOS transistor 342 is electrically coupled to power VDD and a second S/D of PMOS transistor 342 is electrically coupled to a first S/D of PMOS transistor 344. Also, a first S/D of PMOS transistor 346 is electrically coupled to power VDD and a second S/D of PMOS transistor 346 is electrically coupled to a first S/D of PMOS transistor 348. In addition, the second S/D of PMOS transistor 342 is electrically coupled to the second S/D of PMOS transistor 346. The second S/D of PMOS transistor 344 is electrically coupled to the second S/D of PMOS transistor 348 and to a first S/D of each of the NMOS transistors 350 and 354 at output OUTB. The second S/D of NMOS transistor 350 is electrically coupled to a first S/D of the NMOS transistor 352, and the second S/D of NMOS transistor 354 is electrically coupled to a first S/D of the NMOS transistor 356. The second S/D of each of the NMOS transistors 352 and 356 is electrically coupled to a reference VSS, such as ground.

The gates of PMOS transistor 344 and NMOS transistor 352 are electrically coupled together to receive the data signal D[0], and the gates of PMOS transistor 346 and NMOS transistor 354 are electrically coupled together to receive the data signal D[1]. Also, the gates of PMOS transistor 348 and NMOS transistor 350 are electrically coupled together to receive the read word line signal RWL [0] and the gates of PMOS transistor 342 and NMOS transistor 356 are electrically coupled together to receive the read word line signal RWL[1].

In operation, if the read word line signal RWL[1] is at a logic low (0), the PMOS transistor 342 is biased on and the NMOS transistor 356 is biased off. Also, if the read word line signal RWL[0] is at a logic high (1), the PMOS transistor 348 is biased off and the NMOS transistor 350 is biased on. Thus, if data signal D[0] is at a logic low (0), the PMOS transistor 344 is biased on and the NMOS transistor 352 is biased off, such that the output OUTB is at a logic high (1), and if data signal D[0] is at a logic high (1), the PMOS transistor 344 is biased off and the NMOS transistor 352 is biased on, such that the output OUTB is at a logic low (0).

Also, if the read word line signal RWL[0] is at a logic low (0), the PMOS transistor 348 is biased on and the NMOS transistor 350 is biased off, and if the read word line signal RWL[1] is at a logic high (1), the PMOS transistor 342 is biased off and the NMOS transistor 356 is biased on. Thus, if data signal D[1] is at a logic low (0), the PMOS transistor 346 is biased on and the NMOS transistor 354 is biased off, such that the output OUTB is at a logic high (1), and if data signal D[1] is at a logic high (1), the PMOS transistor 346 is biased off and the NMOS transistor 354 is biased on, such that the output OUTB is at a logic low (0).

If each of the read word line signal RWL[0] and the read word line signal RWL[1] is at a logic low (0), the PMOS transistors 342 and 348 are biased on and the NMOS transistors 350 and 356 are biased off, such that the output OUTB is at a logic high (1).

Figure 10:
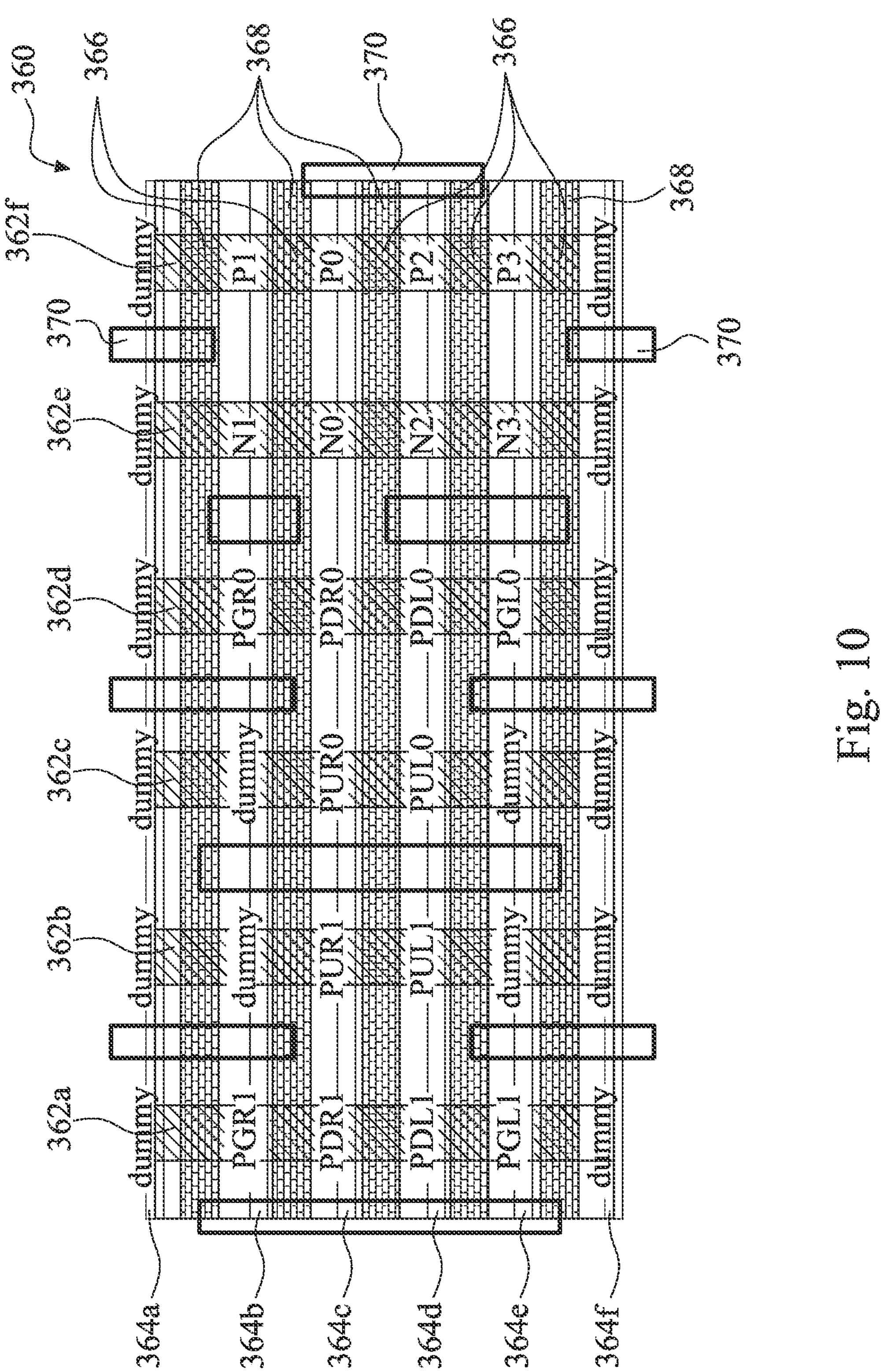
FIG. 10 is a diagram schematically illustrating a transistor layout of the memory cells shown in FIG. 8 and the multiplication circuit of FIG. 9, in accordance with some embodiments.

FIG. 10 is a diagram schematically illustrating a transistor layout 360 of the memory cells 304 and 306 (shown in FIG. 8) and the multiplication circuit 340 of FIG. 9, in accordance with some embodiments. The layout 360 includes twenty transistors, where each of the memory cells 304 and 306 is a 6T SRAM cell, such that the two memory cells 304 and 306 include twelve transistors, and the multiplication circuit 340 includes eight transistors P0-P3 and N0-N3. The layout includes six active areas 362*a*-362*f* and six gate structures 364*a*-364*f* The gate structures 364*a* and 364*f*, at the top and the bottom of the layout 360, are all dummy gate structures.

The memory cell 306 that provides data signal D[1] is laid out with the right and left pass gate transistors PGR1 and PGL1 in the first active area 362*a* and at the gate structures 364*b* and 364*e*, respectively, and the right and left pull-down transistors PDR1 and PDL1 in the first active area 362*a* and at the gate structures 364*c* and 364*d*, respectively. The right and left pull-up transistors PUR1 and PUL1 are in the second active area 362*b* and at the gate structures 364*c* and 364*d*, respectively.

The memory cell 304 that provides data signal D[0] is laid out with the right and left pull-up transistors PUR0 and PUL0 in the third active area 362*c* and at the gate structures 364*c* and 364*d*, respectively. The right and left pass gate transistors PGR0 and PGL0 in the fourth active area 362*d* and at the gate structures 364*b* and 364*e*, respectively, and the right and left pull-down transistors PDR0 and PDL0 in the fourth active area 362*d* and at the gate structures 364*c* and 364*d*, respectively.

The multiplication circuit 340 is laid out with the four NMOS transistors N0-N3 in the fifth active area 362*e* and the four PMOS transistors P0-P3 in the sixth active area 362*f*. The transistors P1 and N1 are at the gate structure 364*b*, the transistors P0 and N0 are at the gate structure 364*c*, the transistors P2 and N2 are at the gate structure 364*d*, and the transistors P3 and N3 are at the gate structure 364*e*.

As noted above, the layout 360 includes six active areas 362*a*-362*f* and six gate structures 364*a*-364*f* The layout 360 also includes MD layers, such as MD layers 366, that are configured to be electrically connected to the active areas 362*a*-362*f*. The layout 360 further includes CMD layers, such as CMD layers 368, that are configured to separate or cut the MD layers 366. In some embodiments, the layout 360 further includes metal layers, such as metal layers 370, that are backside metal layers or frontside metal layers. In some embodiments, the metal layers 370 are part of a power distribution network (PDN) in the layout 360.

Figure 11:
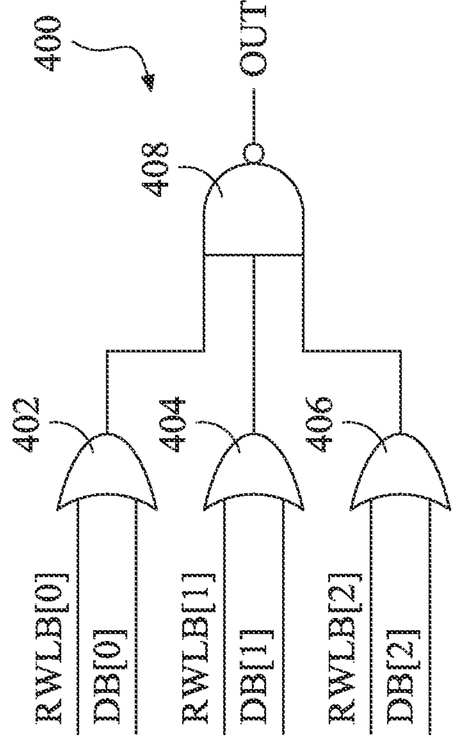
FIG. 11 is a diagram schematically illustrating a three-row multiplication circuit, in accordance with some embodiments.

FIG. 11 is a diagram schematically illustrating a three-row multiplication circuit 400, in accordance with some embodiments. The three-row multiplication circuit 400 is configured to multiply the inverted input XINB and data from each of three memory cells (not shown) and provide a multiplication result. The three-row multiplication circuit 400 includes a first OR gate 402, a second OR gate 404, a third OR gate 406, and a NAND gate 408. Each of the outputs of the first OR gate 402, the second OR gate 404, and the third OR gate 406 is electrically coupled to an input of the NAND gate 408. In some embodiments, the three-row multiplication circuit 400 is like a multiplication circuit 26 (shown in FIG. 1). In some embodiments, the three-row multiplication circuit 400 is like the multiplication circuit 58 (shown in FIG. 2). In some embodiments, the three-row multiplication circuit 400 is, basically, like the multiplication circuit 208 (shown in FIG. 4).

The first OR gate 402, the second OR gate 404, and the third OR gate 406 are configured to receive read word line signals from a word line driver (not shown). In some embodiments, the word line driver is like the word line driver 36 (shown in FIG. 1). In some embodiments, the word line driver is like the word line driver 56 (shown in FIG. 2). In some embodiments, the word line driver is like the word line driver 202 (shown in FIG. 4).

In some embodiments, the first OR gate 402 is configured to receive a read word line signal RWLB[0] from the word line driver and the data signal DB[0] from a first memory cell, the second OR gate 404 is configured to receive a read word line signal RWLB [1] from the word line driver and a data signal DB[1] from a second memory cell, and the third OR gate 406 is configured to receive a read word line signal RWLB[2] from the word line driver and a data signal DB[2] from a third memory cell. The NAND gate 408 receives each of the outputs from the first, second, and third OR gates 402, 404, and 406 and provides a multiplication result at the output OUT of the NAND gate 408.

Figure 12:
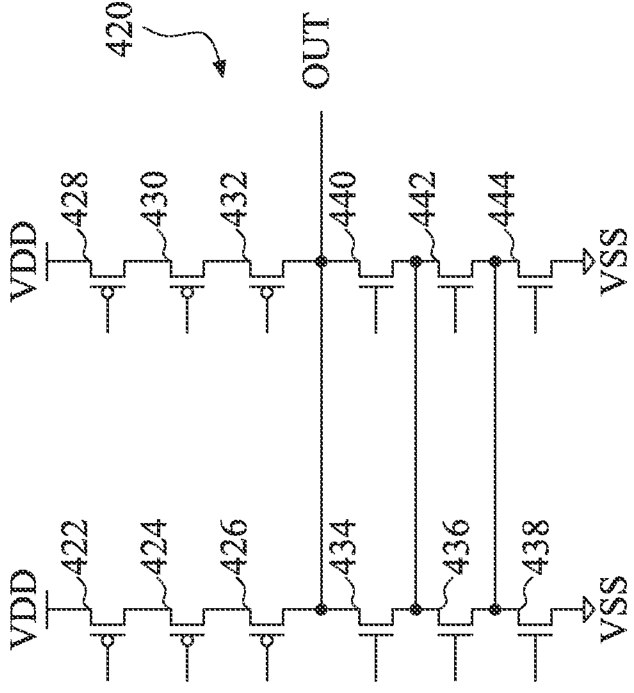
FIG. 12 is a diagram schematically illustrating a MOSFET multiplication circuit that provides the functions of the multiplication circuit of FIG. 11, in accordance with some embodiments.

FIG. 12 is a diagram schematically illustrating a MOSFET multiplication circuit 420 that provides the functions of the multiplication circuit 400 of FIG. 11, in accordance with some embodiments. The multiplication circuit 420 includes twelve transistors, six PMOS transistors 422, 424, 426, 428, 430, and 432 and six NMOS transistors 434, 436, 438, 440, 442, and 444.

A first S/D of PMOS transistor 422 is electrically coupled to power VDD and a second S/D of PMOS transistor 422 is electrically coupled to a first S/D of PMOS transistor 424. Also, a second S/D of PMOS transistor 424 is electrically coupled to a first S/D of PMOS transistor 426. A first S/D of PMOS transistor 428 is electrically coupled to power VDD and a second S/D of PMOS transistor 428 is electrically coupled to a first S/D of PMOS transistor 430. A second S/D of PMOS transistor 430 is electrically coupled to a first S/D of PMOS transistor 432. The second S/D of PMOS transistor 426 is electrically coupled to the second S/D of PMOS transistor 432 and to a first S/D of each of the NMOS transistors 434 and 440 at the output OUT. The second S/D of NMOS transistor 434 is electrically coupled to the second S/D of NMOS transistor 440 and to a first S/D of each of the NMOS transistors 436 and 442. The second S/D of NMOS transistor 436 is electrically coupled to the second S/D of NMOS transistor 442 and to a first S/D of each of the NMOS transistors 438 and 444. The second S/D of each of the NMOS transistors 438 and 444 is electrically coupled to a reference VSS, such as ground.

The gates of the six PMOS transistors 422, 424, 426, 428, 430, and 432 and the six NMOS transistors 434, 436, 438, 440, 442, and 444 are connected to each other and to the read word line signals RWLB[0] and RWLB[1] and the data signals DB[0] and DB[1] to perform the functions of the multiplication circuit 400 of FIG. 11.

Figure 13:
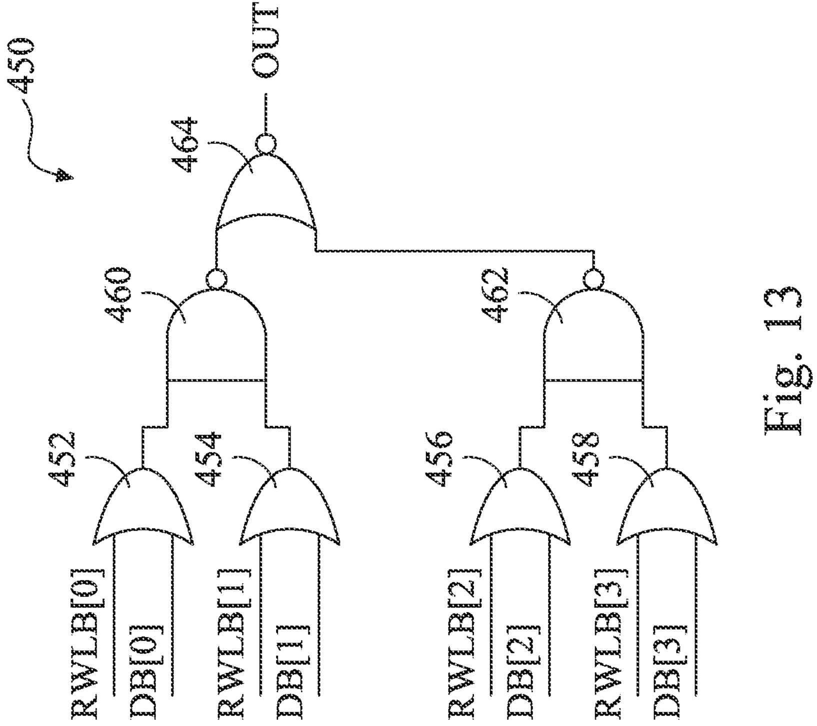
FIG. 13 is a diagram schematically illustrating a four-row multiplication circuit, in accordance with some embodiments.

FIG. 13 is a diagram schematically illustrating a four-row multiplication circuit 450, in accordance with some embodiments. The four-row multiplication circuit 450 is configured to multiply the inverted input XINB and data from each of four memory cells (not shown) and provide a multiplication result. In some embodiments, the four-row multiplication circuit 450 is like a multiplication circuit 26 (shown in FIG.

1). In some embodiments, the four-row multiplication circuit 450 is like the multiplication circuit 58 (shown in FIG. 2). In some embodiments, the four-row multiplication circuit 450 is, basically, like the multiplication circuit 208 (shown in FIG. 4).

The four-row multiplication circuit 450 includes a first OR gate 452, a second OR gate 454, a third OR gate 456, and a fourth OR gate 458. The four-row multiplication circuit 450 further includes a first NAND gate 460, a second NAND gate 462, and a NOR gate 464. Each of the outputs of the first OR gate 452, the second OR gate 454, the third OR gate 456, and the fourth OR gate 458 is electrically coupled to an input of one of the NAND gates. The outputs of the first OR gate 452 and the second OR gate 454 are electrically coupled to inputs of the first NAND gate 460, and the outputs of the third OR gate 456 and the fourth OR gate 458 are electrically coupled to inputs of the second NAND gate 462. The outputs of the first and second NAND gates 460 and 462 are electrically coupled to inputs of the NOR gate 464.

The first OR gate 452, the second OR gate 454, the third OR gate 456, and the fourth OR gate 458 are configured to receive read word line signals from a word line driver (not shown). In some embodiments, the word line driver is like the word line driver 36 (shown in FIG. 1). In some embodiments, the word line driver is like the word line driver 56 (shown in FIG. 2). In some embodiments, the word line driver is like the word line driver 202 (shown in FIG. 4).

In some embodiments, the first OR gate 452 is configured to receive a read word line signal RWLB[0] from the word line driver and the data signal DB[0] from a first memory cell, the second OR gate 454 is configured to receive a read word line signal RWLB [1] from the word line driver and a data signal DB[1] from a second memory cell, the third OR gate 456 is configured to receive a read word line signal RWLB[2] from the word line driver and a data signal DB[2] from a third memory cell, and the fourth OR gate 458 is configured to receive a read word line signal RWLB[3] from the word line driver and a data signal DB[3] from a third memory cell. The NAND gates 460 and 462 receive each of the outputs from the first, second, third, and fourth OR gates 452, 454, 456, and 458 and provide outputs to the NOR gate 464 that provides a multiplication result at the output OUT.

Figure 14:
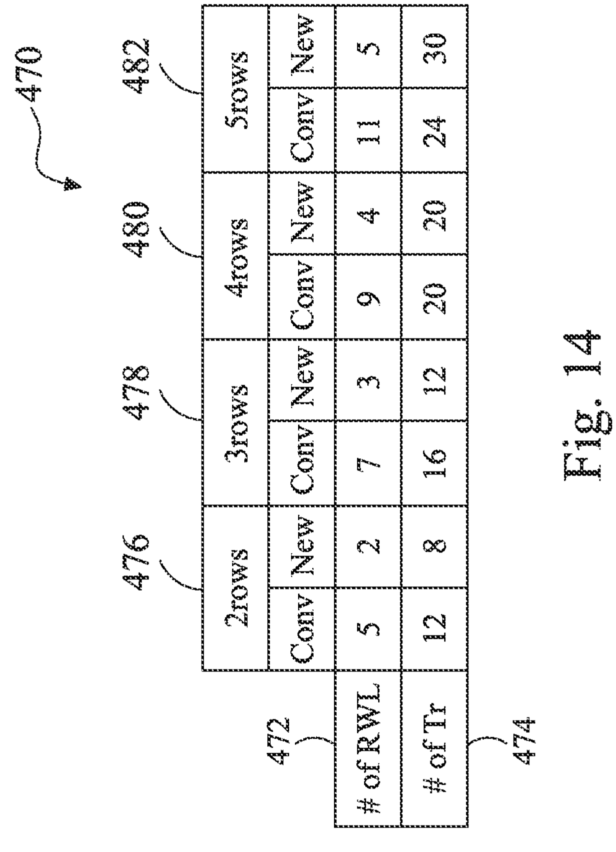
FIG. 14 is a diagram schematically illustrating a table that indicates the number of read word lines (RWLs) and the number of transistors (Trs) in conventional read ports (Conv) and in the new multiplication circuits (New) of this disclosure, in accordance with some embodiments.

FIG. 14 is a diagram schematically illustrating a table 470 that indicates the number of read word lines (RWLs) and the number of transistors (Trs) in conventional read ports (Conv) and the new multiplication circuits (New) of this disclosure, in accordance with some embodiments. Row 472 indicates the number of read word lines (RWLs) and row 474 indicates the number of transistors (Trs) in the conventional read ports and the new multiplication circuits.

As indicated in column 476, for two rows of memory cells the conventional read port includes five RWLs and twelve Trs as compared to only two RWLs and eight Trs in the new multiplication circuits, such as in the multiplication circuit 208 (show in FIG. 4) depicted by MOSFET multiplication circuit 260 of FIG. 6, and in the multiplication circuit 308 (show in FIG. 8) depicted by MOSFET multiplication circuit 340 of FIG. 9. This is a reduction in size of three RWLs and four Trs, which reduces the area used in an integrated circuit.

As indicated in column 478, for three rows of memory cells the conventional read port includes seven RWLs and sixteen Trs as compared to only three RWLs and twelve Trs in the new multiplication circuit, such as in the multiplication circuit 400 of FIG. 11 depicted by MOSFET multiplication circuit 420 of FIG. 12. This is a reduction in size of four RWLs and four Trs, which reduces the area used in an integrated circuit.

As indicated in column 480, for four rows of memory cells the conventional read port includes nine RWLs and twenty Trs as compared to only four RWLs and twenty Trs in the new multiplication circuit. This is a reduction in size of five RWLs, which reduces the area and/or routing used in an integrated circuit.

As indicated in column 482, for five rows of memory cells the conventional read port includes eleven RWLs and twenty-four Trs as compared to five RWLs and thirty Trs in the new multiplication circuit. This is a reduction of five RWLs but an increase of six Trs, which does not reduce the area used in the integrated circuit.

Figure 15:
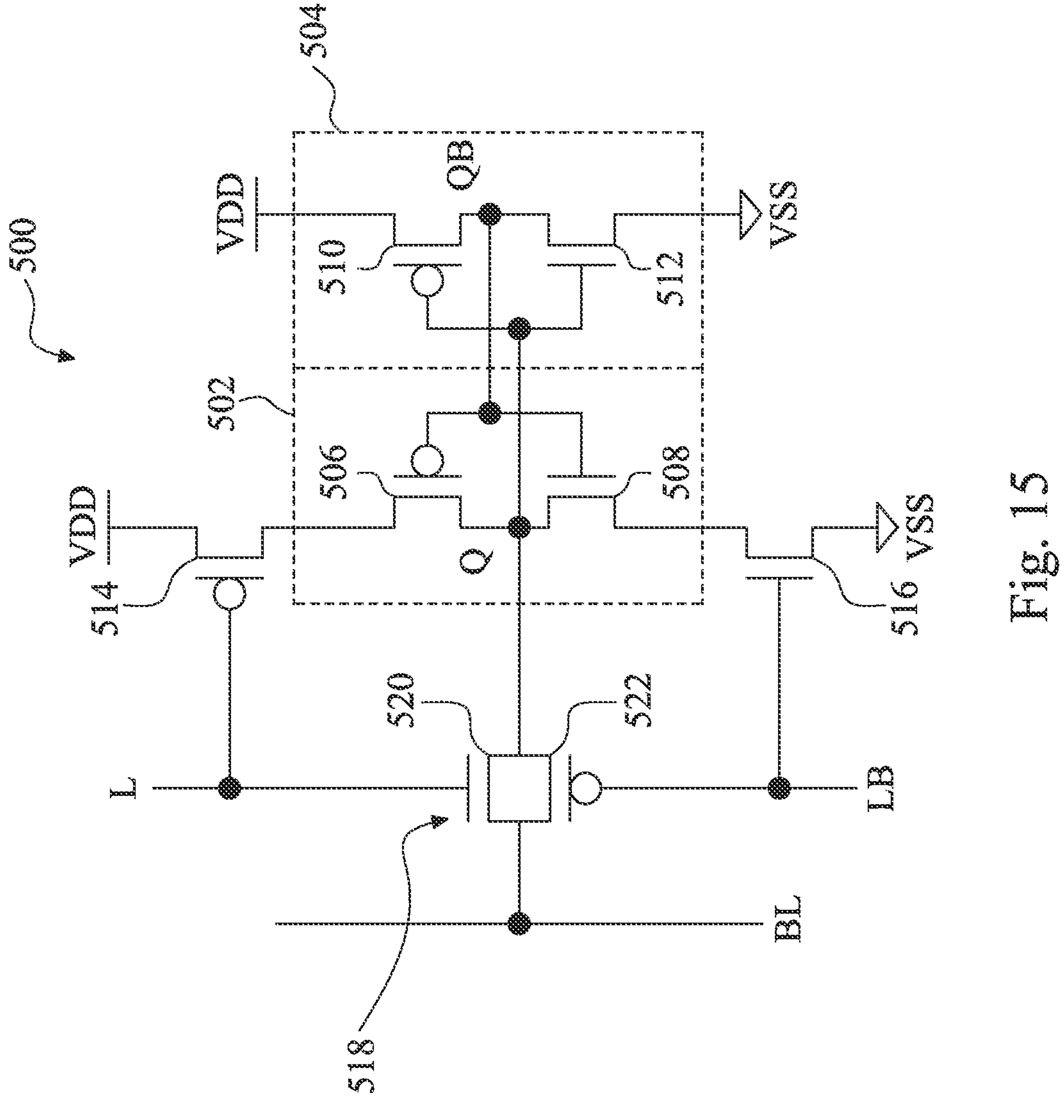
FIG. 15 is a diagram schematically illustrating a latched SRAM cell, in accordance with some embodiments.

FIG. 15 is a diagram schematically illustrating a latched SRAM cell 500, in accordance with some embodiments. The SRAM cell 500 is an eight-transistor (8T) SRAM cell. In some embodiments, the SRAM cell 500 is like one or more of the memory cells 28 (shown in FIG. 1). In some embodiments, the SRAM cell 500 is like one or more of the memory cells 52 and 54 (shown in FIG. 2). In some embodiments, the SRAM cell 500 is used in the CIM device 20 of FIG. 1. In some embodiments, the SRAM cell 500 is used in the row-select and multiply circuit 50 of FIG. 2. In other embodiments, the SRAM cell 500 can include more or fewer than eight transistors.

The SRAM cell 500 includes two cross-coupled inverters 502 and 504. The first inverter 502 includes a first PMOS/NMOS transistor pair 506 and 508, and the second inverter 504 includes a second PMOS/NMOS transistor pair 510 and 512. The SRAM cell 500 further includes latch circuitry including a PMOS latch gate transistor 514, an NMOS latch gate transistor 516, and a transmission gate 518 that includes an NMOS transistor 520 and a PMOS transistor 522.

A first S/D of the PMOS latch gate transistor 514 is electrically coupled to a power supply VDD and a second S/D of the PMOS latch gate transistor 514 is electrically coupled to a first S/D of the left pull-up transistor 506. A first S/D of the NMOS latch gate transistor 516 is electrically coupled to a reference voltage VSS, such as ground, and a second S/D of the NMOS latch gate transistor 516 is electrically coupled to a first S/D of the left pull-down transistor 508. Also, a first S/D of the right pull-up transistor 510 is electrically coupled to a power supply VDD, and a first S/D of the right pull-down transistor 512 is electrically coupled to the reference voltage VSS.

The second S/D of the left pull-up transistor 506 is electrically coupled to the second S/D of the left pull-down transistor 508 and to the gates of the right pull-up transistor 510 and the right pull-down transistor 512 and to each first S/D of the NMOS transistor 520 and the PMOS transistor 522. Each second S/D of the NMOS transistor 520 and the PMOS transistor 522 is electrically coupled to a bit line BL. Also, the second S/D of the right pull-up transistor 510 is electrically coupled to the second S/D of the right pull-down transistor 512 and to the gates of the left pull-up transistor 506 and the left pull-down transistor 508.

A bit of data is stored in the SRAM cell 500 as a voltage at node Q and can be read through the transmission gate 518 via the bit line BL, where access to the node Q is controlled by the transmission gate 518. The node Q bar (QB) stores the complement of the value at node Q, such that if Q is high then QB is low and vice-versa. The gates of the PMOS latch gate transistor 514 and the NMOS transistor 520 are controlled by a latch signal L, and the gates of the NMOS latch gate transistor 516 and the PMOS transistor 522 are controlled by a complementary latch signal LB.

In operation, to write the SRAM cell 500, the latch signal L is set to a high voltage (1) and the complementary latch signal LB is set to a low voltage (0). This biases on the transmission gate 518 including the NMOS transistor 520 and the PMOS transistor 522 and this biases off the PMOS latch gate transistor 514 and the NMOS latch gate transistor 516. The data voltage on the bit-line BL is passed to node Q and the gates of the right pull-up transistor 510 and the right pull-down transistor 512, which provides the complementary data voltage at node QB and to the gates of the left pull-up transistor 506 and the left pull-down transistor 508. Next, the latch signal L is switched to a low voltage (0) and the complementary latch signal LB is switched to a high voltage (1). This latches in the voltages at node Q and node QB. To read the voltage at node Q, the latch signal L is set to a high voltage (1) and the complementary latch signal LB is set to a low voltage (0) to bias on the transmission gate 518 and bias off the PMOS latch gate transistor 514 and the NMOS latch gate transistor 516.

Figure 16:
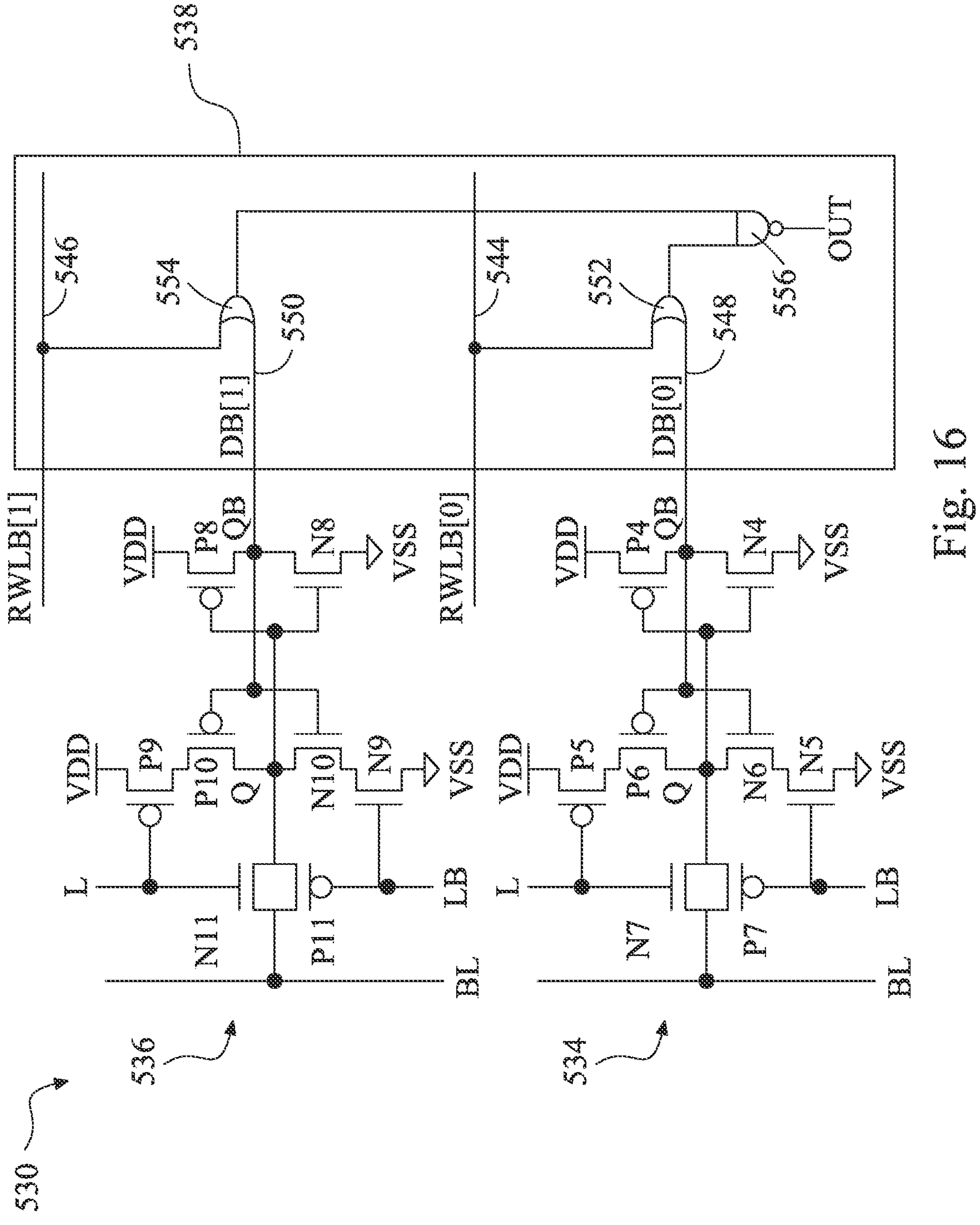
FIG. 16 is a diagram schematically illustrating a row-select and multiply circuit that includes a word line driver (not shown), two 8T SRAM cells, and a multiplication circuit, in accordance with some embodiments.

FIG. 16 is a diagram schematically illustrating a row-select and multiply circuit 530 that includes a word line driver (not shown), two 8T SRAM cells 534 and 536, and a multiplication circuit 538, in accordance with some embodiments. The row-select and multiply circuit 530 is configured to multiply input data bar XINB and data bar DB from memory cells 534 and 536. In other embodiments, the row-select and multiply circuit 530 is configured to multiply input data and data from memory cells in more than two rows, such as from three rows or four rows of memory cells.

The word line driver is like the word line driver 202 (shown in FIG. 4), such that the description is not repeated here. The word line drive provides read word line signal RWLB[0] to the multiplication circuit 538 via first read word line 544 and read word line signal RWLB[1] to the multiplication circuit 538 via second read word line 546. In some embodiments, the word line driver is like the word line driver 36 (shown in FIG. 1). In some embodiments, the word line driver is like the word line driver 56 (shown in FIG. 2).

The memory cells 534 and 536 are electrically coupled to the multiplication circuit 538 to provide stored bits of data to the multiplication circuit 538 in the data signals DB[0] and DB[1]. The memory cell 534 is configured to provide the data signal DB[0] to the multiplication circuit 538 via data line 548, and the memory cell 536 provides the data signal DB[1] to the multiplication circuit 538 via data line 550. Each of the memory cells 534 and 536 is like the SRAM cell 500 of FIG. 15 and the description is not repeated here. Also, in some embodiments, each of the memory cells 534 and 536 is like one of the memory cells 28 (shown in FIG. 1), where each of the memory cells 534 and 536 is from a different one of the rows 30 and 32 of a memory cell block 24. In some embodiments, the memory cells 534 and 536 are configured to store weight data, such as weights for CNNs.

The multiplication circuit 538 includes a first OR gate 552, a second OR gate 554, and a NAND gate 556. The first OR gate 552 is configured to receive the read word line signal RWLB[0] from the word line driver and the data signal DB[0] from the memory cell 534. The second OR gate 554 is configured to receive the read word line signal RWLB[1] from the word line driver and the data signal DB[1] from the memory cell 536. The NAND gate 556 receives an output from each of the first and second OR gates 552 and 554 and provides the multiplication result at output OUT. In some embodiments, the multiplication circuit 538 is like a multiplication circuit 26 (shown in FIG. 1). In some embodiments, the multiplication circuit 538 is like the multiplication circuit 58 (shown in FIG. 2).

In operation, the read word driver de-selects one of the memory cells 534 and 536 by passing a logic high (1) to one of the OR gates 552 or 554, which passes the logic high (1) to one input of the NAND gate 556. The read word driver selects the other one of the memory cells 534 and 536 by passing the inverted input signal XINB to the other one of the OR gates 552 or 554. This selected OR gate 552 or 554 receives the inverted input signal XINB and one of the data signals DB[0] or DB[1] from the memory cells 534 and 536 and provides an output signal to the other input of the NAND gate 556. The NAND gate 556 provides the multiplication result at the output OUT.

Figure 17:
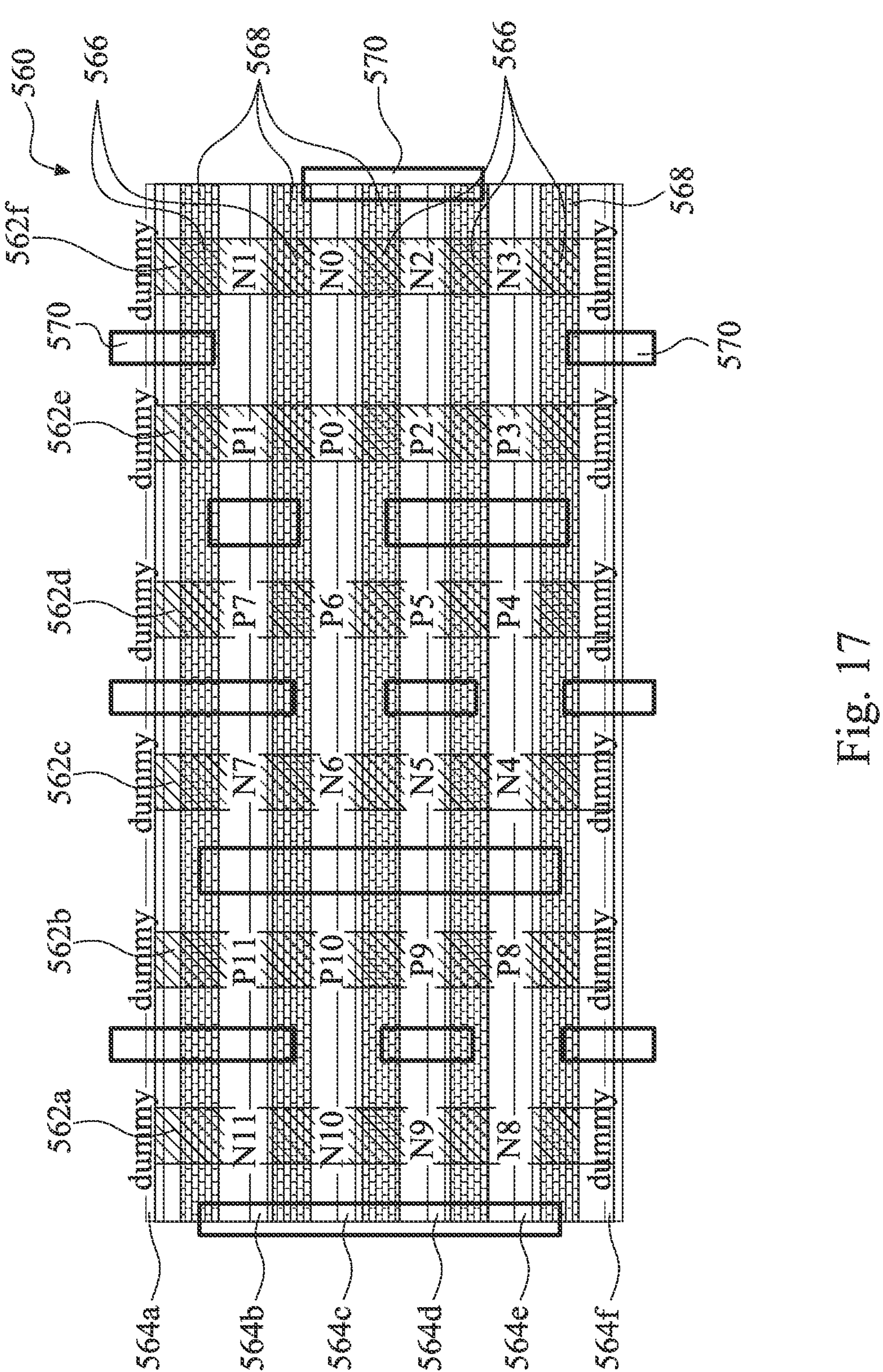
FIG. 17 is a diagram schematically illustrating a transistor layout of the memory cells shown in FIG. 16 and the multiplication circuit shown in FIG. 16, in accordance with some embodiments.

FIG. 17 is a diagram schematically illustrating a transistor layout 560 of the memory cells 534 and 536 (shown in FIG. 16) and the multiplication circuit 538 (shown in FIG. 16), in accordance with some embodiments. The multiplication circuit 538 is like the multiplication circuit 208 (shown in FIG. 4) and laid out like the MOSFET multiplication circuit 260 of FIG. 6 with four PMOS transistors P0-P3 and four NMOS transistors N0-N3. Also, each of the memory cells 536 and 538 is like the SRAM cell 500 of FIG. 15, such that numerals from FIG. 15 are used in this description of the transistor layout 560.

The layout 560 includes twenty-four transistors, where each of the memory cells 534 and 536 is an 8T SRAM cell, such that the two memory cells 534 and 536 include sixteen transistors, and the multiplication circuit 538 includes eight transistors P0-P3 and N0-N3. The layout includes six active areas **562*a*-562*f* and six gate structures 564*a*-564*f* The gate structures 564*a* and 564*f*, at the top and the bottom of the layout 560**, are all dummy gate structures.

The memory cell 536 that provides data signal DB[1] is laid out with the NMOS transistor 520 (N11), the left pull-down transistor 508 (N10), the NMOS latch gate transistor 516 (N9), and the right pull-down transistor 512 (N8) in the first active area **562*a* and at the gate structures 564*b*, 564*c*, 564*d*, and 564*e*, respectively. The memory cell 536 is also laid out with the PMOS transistor 522 (P11), the left pull-up transistor 506 (P10), the PMOS latch gate transistor 514 (P9), and the right pull-up transistor 510 (P8) in the second active area 562*b* and at the gate structures 564*b*, 564*c*, 564*d*, and 564*e***, respectively.

The memory cell 534 that provides data signal DB[0] is laid out with the NMOS transistor 520 (N7), the left pull-down transistor 508 (N6), the NMOS latch gate transistor 516 (N5), and the right pull-down transistor 512 (N4) in the third active area **562*c* and at the gate structures 564*b*, 564*c*, 564*d*, and 564*e*, respectively. The memory cell 534 is also laid out with the PMOS transistor 522 (P7), the left pull-up transistor 506 (P6), the PMOS latch gate transistor 514 (P5), and the right pull-up transistor 510 (P4) in the fourth active area 562*d* and at the gate structures 564*b*, 564*c*, 564*d*, and 564*e***, respectively.

The multiplication circuit 538 is laid out with the four PMOS transistors P0-P3 in the fifth active area **562*e*and with the four NMOS transistors N0-N3 in the sixth active area 562*f* The transistors P1 and N1 are at the gate structure 564*b*, the transistors P0 and N0 are at the gate structure 564*c*, the transistors P2 and N2 are at the gate structure 564*d*, and the transistors P3 and N3 are at the gate structure 564*e***.

As noted above, the layout 560 includes six active areas **562*a*-562*f* and six gate structures 564*a*-564*f* like the layout 280 of FIG. 7. The layout 560 also includes MD layers, such as MD layers 566, that are configured to be electrically connected to the active areas 562***a*-562*f* The layout 560 further includes CMD layers, such as CMD layers 568, that are configured to separate or cut the MD layers 566. In some embodiments, the layout 560 further includes metal layers, such as metal layers 570, that are backside metal layers or frontside metal layers. In some embodiments, the metal layers 570 are part of a power distribution network (PDN) in the layout 560.

Figure 18:
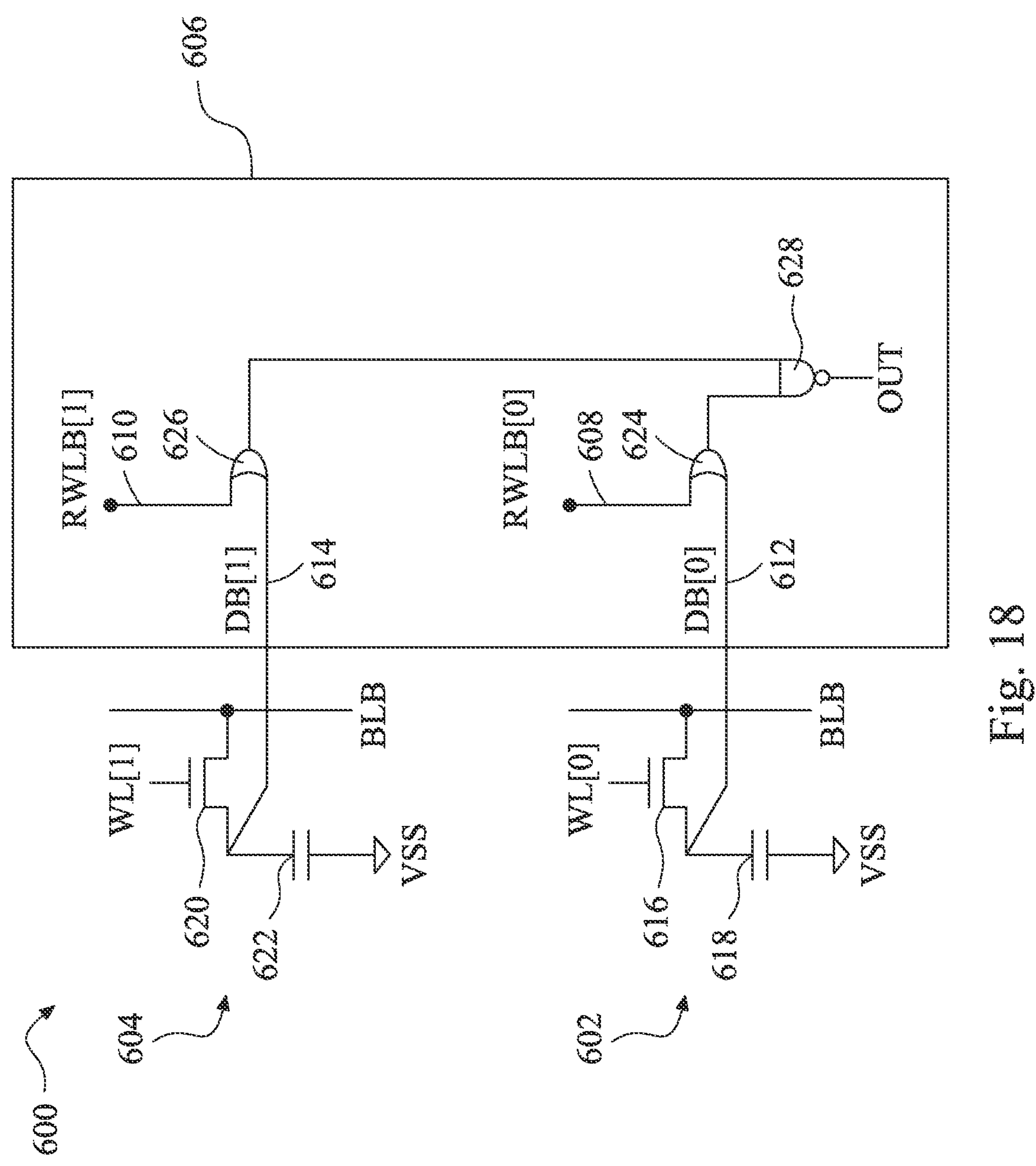
FIG. 18 is a diagram schematically illustrating a row-select and multiply circuit that includes a word line driver (not shown), two 1T1C memory cells, and a multiplication circuit, in accordance with some embodiments.

FIG. 18 is a diagram schematically illustrating a row-select and multiply circuit 600 that includes a word line driver (not shown), two 1T1C memory cells 602 and 604, and a multiplication circuit 606, in accordance with some embodiments. The row-select and multiply circuit 600 is configured to multiply input data bar XINB and data bar DB signals from memory cells 602 and 604. In other embodiments, the row-select and multiply circuit 600 is configured to multiply input data and data from memory cells in more than two rows, such as from three rows or four rows of memory cells.

The word line driver (not shown) is like the word line driver 202 (shown in FIG. 4), such that the description is not repeated here. The word line drive provides read word line signal RWLB[0] to the multiplication circuit 606 via first read word line 608 and read word line signal RWLB[1] to the multiplication circuit 606 via second read word line 610. In some embodiments, the word line driver is like the word line driver 36 (shown in FIG. 1). In some embodiments, the word line driver is like the word line driver 56 (shown in FIG. 2).

The memory cells 602 and 604 are electrically coupled to the multiplication circuit 606 to provide stored bits of data to the multiplication circuit 606 in the data signals DB[0] and DB[1]. The memory cell 602 is configured to provide the data signal DB[0] to the multiplication circuit 606 via data line 612, and the memory cell 604 is configured to provide the data signal DB[1] to the multiplication circuit 606 via data line 614. Also, in some embodiments, each of the memory cells 602 and 604 is like one of the memory cells 28 (shown in FIG. 1), where each of the memory cells 602 and 604 is from a different one of the rows 30 and 32 of a memory cell block 24. In some embodiments, the memory cells 602 and 604 are configured to store weight data, such as weights for CNNs.

The memory cell 602 includes a first transistor 616 and a first capacitor 618. One S/D of the first transistor 616 is electrically coupled to bit-line bar BLB and the other S/D of the first transistor 616 is electrically coupled to one side of the first capacitor 618. The other side of the first capacitor 618 is electrically coupled to a reference VSS, such as ground. The gate of the first transistor 616 is electrically coupled to word line WL[0] for reading the data from and writing the data to the first capacitor 618. The one side of the first capacitor 618 is electrically coupled to provide the data signal DB[0] to the multiplication circuit 606 via data line 612.

The memory cell 604 includes a second transistor 620 and a second capacitor 622. One S/D of the second transistor 620 is electrically coupled to bit-line bar BLB and the other S/D of the second transistor 620 is electrically coupled to one side of the second capacitor 622. The other side of the second capacitor 622 is electrically coupled to the reference VSS, such as ground. The gate of the second transistor 620 is electrically coupled to word line WL[0] for reading the data from and writing the data to the second capacitor 622. The one side of the second capacitor 622 is electrically coupled to provide the data signal DB[1] to the multiplication circuit 606 via data line 614.

The multiplication circuit 606 includes a first OR gate 624, a second OR gate 626, and a NAND gate 628. The first OR gate 624 is configured to receive the read word line signal RWLB[0] from the word line driver and the data signal DB[0] from the memory cell 602. The second OR gate 626 is configured to receive the read word line signal RWLB[1] from the word line driver and the data signal DB[1] from the memory cell 604. The NAND gate 628 receives an output from each of the first and second OR gates 624 and 626 and provides the multiplication result at output OUT. In some embodiments, the multiplication circuit 606 is like a multiplication circuit 26 (shown in FIG. 1). In some embodiments, the multiplication circuit 606 is like the multiplication circuit 58 (shown in FIG. 2).

In operation, the read word driver de-selects one of the memory cells 602 and 604 by passing a logic high (1) to one of the OR gates 624 and 626, which passes the logic high (1) to one input of the NAND gate 628. The read word driver selects the other one of the memory cells 602 and 604 by passing the inverted input signal XINB to the other one of the OR gates 624 and 626. This selected OR gate 624 or 626 receives the inverted input signal XINB and one of the data signals DB[0] or DB[1] from the memory cells 602 and 604 and provides an output signal to the other input of the NAND gate 628. The NAND gate 628 provides the multiplication result at the output OUT.

Figure 19:
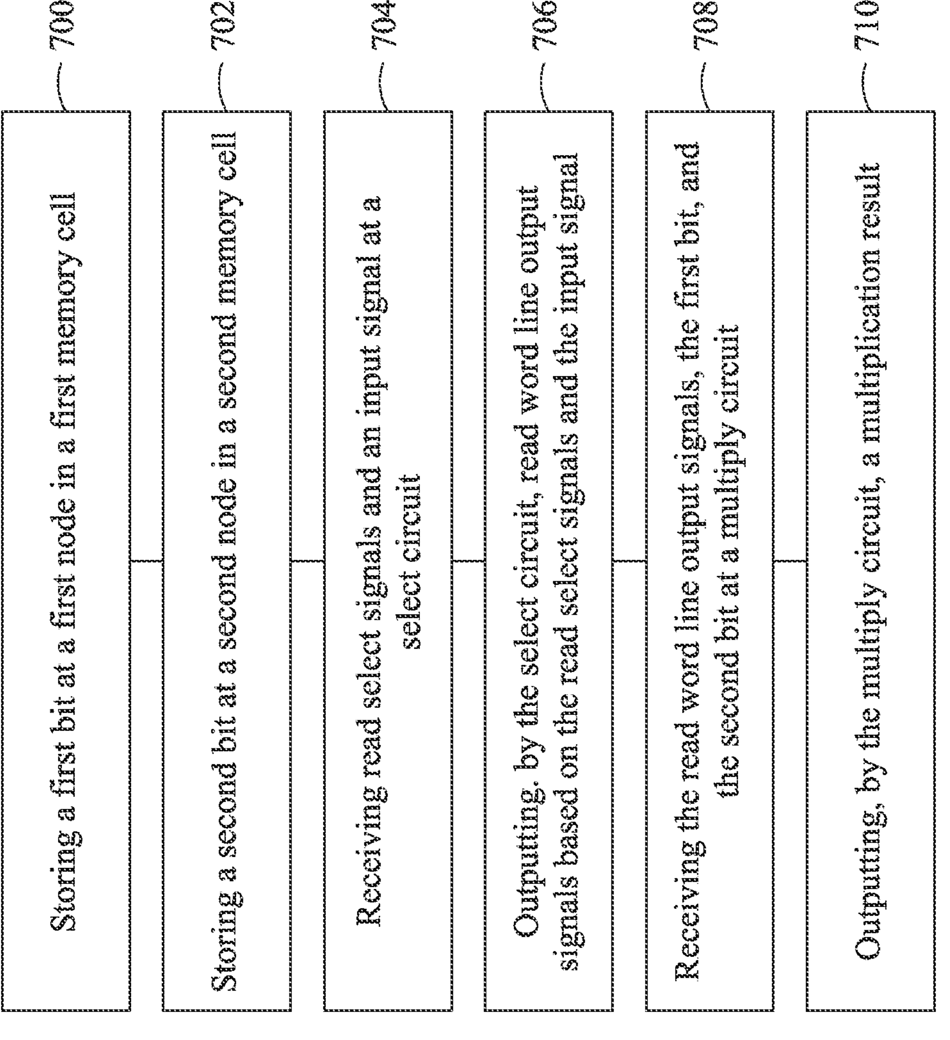
FIG. 19 is a diagram schematically illustrating a method of multiplying in an integrated circuit memory, in accordance with some embodiments.

FIG. 19 is a diagram schematically illustrating a method of multiplying in an integrated circuit memory, in accordance with some embodiments. In some embodiments the method is performed in a CIM device and in a CNN application.

At step 700, the method includes storing a first bit at a first node in a first memory cell and, at step 702, the method includes storing a second bit at a second node in a second memory cell. In some embodiments, the first memory cell is one of the memory cells 28, 52, 204, 304, 534, and 602. In some embodiments, the second memory cell is one of the memory cells 28, 54, 206, 306, 536, and 604. In some embodiments, each of the first and second memory cells is one of the memory cells 28, 52, 54, 204, 206, 304, 306, 534, 536, 602, and 604.

At step 704, the method includes receiving read select signals and an input signal at a select circuit. In some embodiments, the select circuit is like one of the word line driver circuits 36, 56, 202, and 302. In some embodiments, receiving read select signals and an input signal at a select circuit includes receiving one of the read select signals and the input signal at a first select logic element and receiving another one of the read select signals and the input signal at a second select logic element. In some embodiments, one or more of the first and second select logic elements is a NAND gate. In some embodiments, one or more of the first and second logic elements is an AND gate.

At step 706, the method includes outputting, by the select circuit, read word line output signals based on the read select signals and the input signal. In some embodiments, outputting, by the select circuit, read word line output signals based on the read select signals and the input signal includes outputting, by the first select logic element, one of the read word line output signals and outputting, by the second select logic element, another one of the read word line output signals.

At step 708, the method includes receiving the read word line output signals, the first bit, and the second bit at a multiply circuit and, at step 710, outputting, by the multiply circuit, a multiplication result. In some embodiments, the multiply circuit, i.e., the multiplication circuit, is like one of the multiplication circuits 26, 58, 208, 308, 538, and 606.

In some embodiments, receiving the read word line output signals, the first bit, and the second bit at a multiply circuit includes receiving one of the read word line output signals and the first bit at a first logic element and receiving another one of the read word line output signals and the second bit at a second logic element. In some embodiments, the method includes receiving a first output that is based on the one of the read word line output signals and the first bit from the first logic element at a third logic element, and receiving a second output that is based on the other one of the read word line output signals and the second bit from the second logic element at the third logic element, and outputting a multiplication result that is based on the first output and the second out from the third logic element. In some embodiments, the first logic element is one of an OR gate or an AND gate. In some embodiments, the second logic element is one of an OR gate or an AND gate. In some embodiments, the third logic element is one of a NAND gate or a NOR gate.

Disclosed embodiments thus provide CIM devices that include read word line driver circuits and memory cells electrically coupled to a multiplication circuit. The read word line driver circuits receive input data and read select signals and provide read word line signals to the multiplication circuit. The read word line signals select one of the memory cells and the multiplication circuit multiplies the input signal, such as input signal bar XINB, with the data signal, such as data signal bar DB, from the selected memory cell. This provides multiplication results, where data from the memory cells are multiplied by the input data. In some embodiments, the multiplication circuit provides multiplication for two rows of memory cells. In some embodiments, the multiplication circuit provides multiplication for three rows of memory cells. In some embodiments, the multiplication circuit provides multiplication for four rows of memory cells. In some embodiments, the data from the memory cells are weights used in neural networks, such as CNNs.

Disclosed embodiments further include a read word line driver circuit and 6T or 8T SRAM cells connected to logic gates in a multiplication circuit. In some embodiments, logic gates in the read word line driver circuit include NAND gates and/or AND gates. In some embodiments, the logic gates in the multiplication circuit include OR gates and NAND gates and/or AND gates and NOR gates. In other embodiments, the memory cells can be different memory cells, such as other data latches, flip-flops, and/or memory cells including flash memory, MRAM, RRAM, SRAM, and DRAM cells. In some embodiments, the memory cells include 1T1C memory cells.

Also, in disclosed embodiments, the number of transistors and read word lines used in the multiplication circuits are reduced compared to previous read port configurations. In some embodiments, the number of transistors and read word lines used in the multiplication circuits are reduced to eight transistors and two read word lines compared to twelve transistors and five read word lines in the previous read port configurations.

Advantages of the disclosed embodiments include CIM cell and logic circuit arrangements that reduce the amount of space occupied on a chip, provide in-memory multiply operations that improve performance such as speed performance, and reduce energy/power requirements. Thus, improving power, performance, and area (PPA).

In accordance with some embodiments, a device includes a first memory cell, a second memory cell, a first logic element, a second logic element, and a third logic element. The first memory cell is configured to store a first bit at a first node, and the second memory cell is configured to store a second bit at a second node. The first logic element includes a first node input terminal coupled to the first node, the second logic element includes a second node input terminal coupled to the second node, and the third logic element includes a first input terminal coupled to a first output terminal of the first logic element and a second input terminal coupled to a second output terminal of the second logic element.

In accordance with further embodiments, a device includes a select circuit, a memory circuit, and a multiply circuit. The select circuit is configured to receive read select signals and an input signal and provide read word line output signals based on the read select signals and the input signal. The memory circuit includes a first memory cell configured to store a first bit at a first node, and a second memory cell configured to store a second bit at a second node. The multiply circuit is configured to receive the read word line output signals, the first bit, and the second bit and provide a multiplication result.

In accordance with still further disclosed aspects, a method of multiplying in an integrated circuit memory includes: storing a first bit at a first node in a first memory cell; storing a second bit at a second node in a second memory cell; receiving read select signals and an input signal at a select circuit; outputting, by the select circuit, read word line output signals based on the read select signals and the input signal; receiving the read word line output signals, the first bit, and the second bit at a multiply circuit; and outputting, by the multiply circuit, a multiplication result.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first memory cell configured to store a first bit at a first node;

a second memory cell configured to store a second bit at a second node;

a logic element configured to perform logic functions of:

a first logic element configured to perform an OR function and including a first node input terminal connected to the first node, a first read word line input terminal connected to a first read word line, and a first output terminal;

a second logic element configured to perform an OR function and including a second node input terminal connected to the second node, a second read word line input terminal connected to a second read word line, and a second output terminal; and a third logic element configured to perform a NAND function and including a first input terminal connected to the first output terminal of the first logic element and a second input terminal connected to the second output terminal of the second logic element, wherein the first input terminal and the second input terminal are at different nodes.

2. The device of claim 1, wherein the first memory cell includes a latch.

3. The device of claim 1, wherein the first memory cell includes a capacitor.

4. The device of claim 1, wherein the logic element consists essentially of eight metal-oxide semiconductor field-effect transistors and interconnections between at least some of the eight metal-oxide semiconductor field-effect transistors.

5. The device of claim 1, comprising:

a third memory cell configured to store a third bit at a third node; and the logic element is configured to perform logic functions of a fourth logic element including a third node input terminal coupled to the third node, wherein the third logic element includes a third input terminal coupled to a third output terminal of the fourth logic element.

6. The device of claim 5, wherein the logic element consists essentially of twelve metal-oxide semiconductor field-effect transistors and interconnections between at least some of the twelve metal oxide semiconductor field effect transistors.

7. The device of claim 1, comprising:

a third memory cell configured to store a third bit at a third node;

a fourth memory cell configured to store a fourth bit at a fourth node;

the logic element configured to perform logic functions of:

a fourth logic element including a third node input terminal coupled to the third node;

a fifth logic element including a fourth node input terminal coupled to the fourth node;

a sixth logic element including a third input terminal coupled to a third output terminal of the fourth logic element and a fourth input terminal coupled to a fourth output terminal of the fifth logic element; and a seventh logic element including a first logic input terminal coupled to a first logic output terminal of the third logic element and a second logic input terminal coupled to a second logic output terminal of the sixth logic element.

8. The device of claim 1, wherein the logic element consists essentially of eight metal-oxide semiconductor field-effect transistors and interconnections between at least some of the eight metal-oxide semiconductor field-effect transistors, wherein only two of the eight metal-oxide semiconductor field-effect transistors have drain/source paths directly connected to a power source.

9. The device of claim 1, wherein the logic element consists essentially of eight metal-oxide semiconductor field-effect transistors and interconnections between at least some of the eight metal-oxide semiconductor field-effect transistors, wherein four of the eight metal-oxide semiconductor field-effect transistors are N-channel metal-oxide semiconductor field-effect transistors and four of the eight metal-oxide semiconductor field-effect transistors are P-channel metal-oxide semiconductor field-effect transistors.

10. The device of claim 9, wherein in a first series of transistors two of the P-channel metal-oxide semiconductor field-effect transistors are connected in series to two of the N-channel metal-oxide semiconductor field-effect transistors, and in a second series of transistors another two of the P-channel metal-oxide semiconductor field-effect transistors are connected in series to another two of the N-channel metal-oxide semiconductor field-effect transistors.

11. A device, comprising:

a select circuit configured to receive read select signals and an input signal and provide read word line output signals on a first read word line and a second read word line based on the read select signals and the input signal;

a memory circuit including:

a first memory cell configured to store a first bit at a first node; and a second memory cell configured to store a second bit at a second node; and a multiply circuit configured to receive the read word line output signals, the first bit, and the second bit and provide a multiplication result, the multiply circuit configured to perform logic functions of:

a first logic element configured to perform an OR function and including a first node input terminal connected to the first node, a first read word line input terminal connected to the first read word line, and a first output terminal;

a second logic element configured to perform an OR function and including a second mode input terminal connected to the second node, a second read word line input terminal connected to the second read word line, and a second output terminal; and a third logic element configured to perform a NAND function and including a first input terminal connected to the first output terminal of the first logic element and a second input terminal connected to the second output terminal of the second logic element, wherein the first input terminal and the second input terminal are different nodes.

12. The device of claim 11, wherein the select circuit includes:

a first select logic element configured to receive one of the read select signals and the input signal and provide one of the read word line output signals; and a second select logic element configured to receive another one of the read select signals and the input signal and provide another one of the read word line output signals.

13. The device of claim 11, wherein the multiply circuit consists essentially of eight metal-oxide semiconductor field-effect transistors and interconnections between at least some of the eight metal-oxide semiconductor field-effect transistors.

14. The device of claim 11, wherein the first memory cell includes a latch that includes six or more metal-oxide semiconductor field-effect transistors.

15. The device of claim 11, wherein the multiply circuit consists essentially of eight metal-oxide semiconductor field-effect transistors and interconnections between at least some of the eight metal-oxide semiconductor field-effect transistors, wherein four of the eight metal-oxide semiconductor field-effect transistors are N-channel metal-oxide semiconductor field-effect transistors and four of the eight metal-oxide semiconductor field-effect transistors are P-channel metal-oxide semiconductor field-effect transistors.

16. The device of claim 15, wherein in a first series of transistors two of the P-channel metal-oxide semiconductor field-effect transistors are connected in series to two of the N-channel metal-oxide semiconductor field-effect transistors, and in a second series of transistors another two of the P-channel metal-oxide semiconductor field-effect transistors are connected in series to another two of the N-channel metal-oxide semiconductor field-effect transistors.

17. A method of multiplying in an integrated circuit memory, comprising:

storing a first bit at a first node in a first memory cell;

storing a second bit at a second node in a second memory cell;

receiving read select signals and an input signal at a select circuit;

outputting, by the select circuit, read word line output signals based on the read select signals and the input signal;

receiving the read word line output signals, the first bit, and the second bit at a multiply circuit;

and outputting, by the multiply circuit, a multiplication result wherein receiving the read word line output signals, the first bit, and the second bit at a multiply circuit includes:

receiving one of the read word line output signals and the first bit at a first logic element configured to perform an OR function and including a first output terminal:

receiving another one of the read word line output signals and the second bit at a second logic element configured to perform an OR function and including a second output terminal:

receiving a first output from the first output terminal of the first logic element at a first input terminal of a third logic element configured to perform a NAND function; and receiving a second output from the second output terminal of the second logic element at a second input terminal of the third logic element, wherein the first input terminal and the second input terminal are different nodes.

18. The method of claim 17, wherein receiving read select signals and an input signal at a select circuit includes:

receiving one of the read select signals and the input signal at a first select logic element; and receiving another one of the read select signals and the input signal at a second select logic element.

19. The method of claim 17, wherein outputting, by the select circuit, read word line output signals based on the read select signals and the input signal includes:

outputting, by a first select logic element, one of the read word line output signals; and outputting, by a second select logic element, another one of the read word line output signals.

20. The method of claim 17, comprising:

outputting the multiplication result based on the first output and the second output from the third logic element.

* * * * *